United States Patent
Hafizi et al.

(10) Patent No.: US 10,191,526 B2
(45) Date of Patent: Jan. 29, 2019

(54) APPARATUS AND METHOD FOR TRANSMITTING DATA SIGNAL BASED ON DIFFERENT SUPPLY VOLTAGES

(71) Applicant: QUALCOMM Incorporated, San Diego, CA (US)

(72) Inventors: Madjid Hafizi, San Diego, CA (US); Chiu Keung Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 200 days.

(21) Appl. No.: 15/345,871

(22) Filed: Nov. 8, 2016

(65) Prior Publication Data
US 2018/0129256 A1    May 10, 2018

(51) Int. Cl.
G06F 1/26 (2006.01)
G06F 1/32 (2006.01)
(Continued)

(52) U.S. Cl.
CPC ............ G06F 1/266 (2013.01); G06F 1/3296 (2013.01); H03K 19/00315 (2013.01); H03K 19/017509 (2013.01)

(58) Field of Classification Search
CPC .................................... G06F 1/26; G06F 1/32
See application file for complete search history.

(56) References Cited

U.S. PATENT DOCUMENTS 5,570,043 A * 10/1996 Churchill ......... H03K 19/00315
  326/21
6,060,937 A *  5/2000 Singer .................. H03K 17/063
  327/390
(Continued)

FOREIGN PATENT DOCUMENTS

EP    1081860 A1    3/2001
EP    2326008 A1    5/2011

OTHER PUBLICATIONS

Partial International Search Report—PCT/US2017/055930—ISA/EPO—dated Jan. 18, 2018.
(Continued)

*Primary Examiner* — Phil K Nguyen
(74) *Attorney, Agent, or Firm* — Loza & Loza, LLP/Qualcomm

(57) ABSTRACT

A transmit driver is configured to operate under distinct supply voltage provided at output differential terminals. The transmit driver includes differential input transistors, first and second pairs of over-voltage protection differential transistors, and a current source coupled in series between the output terminals and a lower voltage rail. The transmit driver includes a first bias voltage generator configured to generate a first bias voltage based on the supply voltage across the output differential terminals. The first bias voltage is applied to the control terminals of the first pair of over-voltage protection transistors. The transmit driver includes a second bias generator for generating a second (substantially fixed) bias voltage for the control terminals of the second pair of over-voltage protection transistors. The transmit driver may be configured to operate based on a 3.3V supply voltage provided by an HDMI sink, or based on a 1.8V supply voltage provided by a bridge chip.

27 Claims, 10 Drawing Sheets

(51) Int. Cl.
*H03K 19/003* (2006.01)
*H03K 19/0175* (2006.01)

(56) References Cited

U.S. PATENT DOCUMENTS

| | | | | |
|---|---|---|---|---|
| 6,118,303 | A * | 9/2000 | Schmitt | H03K 19/00315 326/57 |
| 6,294,943 | B1 * | 9/2001 | Wall | H03K 19/00315 327/328 |
| 7,768,306 | B2 | 8/2010 | Chiu | |
| 8,581,628 | B2 | 11/2013 | Yeh et al. | |
| 8,773,831 | B2 * | 7/2014 | Onishi | H03F 3/45188 330/298 |
| 8,994,454 | B2 * | 3/2015 | Murakami | H03F 1/02 330/207 P |
| 9,130,520 | B2 | 9/2015 | Mitsuishi et al. | |
| 9,281,967 | B2 | 3/2016 | Yao et al. | |
| 9,299,669 | B2 | 3/2016 | Shi et al. | |
| 2001/0038564 | A1 * | 11/2001 | Verbeck | G11C 7/062 365/207 |
| 2009/0141180 | A1 * | 6/2009 | Kondo | G09G 5/006 348/723 |
| 2009/0289681 | A1 * | 11/2009 | Keady | H04L 25/02 327/179 |
| 2011/0148200 | A1 * | 6/2011 | Burns | H02M 1/32 307/43 |
| 2011/0194628 | A1 | 8/2011 | Kim | |
| 2011/0291742 | A1 * | 12/2011 | Wang | H03K 19/00384 327/513 |
| 2012/0210385 | A1 | 8/2012 | Cirstea et al. | |
| 2016/0354612 | A1 * | 12/2016 | Butz | A61N 1/3706 |

OTHER PUBLICATIONS

International Search Report and Written Opinion—PCT/US2017/055930—ISA/EPO—dated May 4, 2018.

* cited by examiner

APPARATUS AND METHOD FOR TRANSMITTING DATA SIGNAL BASED ON DIFFERENT SUPPLY VOLTAGES

BACKGROUND

Field

Aspects of the present disclosure relate generally to data signal transmitters (also known as "transmit drivers"), and in particular, to an apparatus and method for transmitting data signal based on different supply voltages.

Background

A transmit driver or transmitter at a High-Definition Multimedia Interface (HDMI) data source may operate under a supply voltage provided by an HDMI data sink via an HDMI cable connected to an HDMI port. In such case, the supply voltage provided by the HDMI data sink is approximately 3.3V.

Other transmit driver or transmitter at an HDMI data source may operate under a supply voltage provided by a bridge chip located at the HDMI data source between the transmit driver and a non-HDMI port (e.g., such as a Universal Serial Bus (USB) port). The bridge chip receives the 3.3V supply voltage from an HDMI data sink via a communication cable (e.g., a USB cable), which connects the HDMI data source device to the HDMI data sink device. The bridge chip converts the 3.3V into a 1.8V supply voltage for use by the transmit driver.

Because of the different supply voltages, the transmit driver configured to use the 3.3V supply voltage is designed differently than the transmit driver configured to use the 1.8V supply voltage. As a result, different chips at the HDMI data source are required depending on which supply voltage source is used. Such different chips add costs and logistical complexity in the production of HDMI data source devices.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including an input transistor configured to generate an output data signal at an output terminal based on an input data signal applied to a control terminal of the input transistor; and a first over-voltage protection transistor coupled in series with the input transistor between the output terminal and a voltage rail, wherein the first over-voltage protection transistor includes a control terminal configured to receive a first bias voltage based on a supply voltage at the output terminal, and wherein the first bias voltage biases the first over-voltage protection transistor to prevent over-voltage stress to the first over-voltage protection transistor and the input transistor.

Another aspect of the disclosure relates to a method including applying an input data signal to a control terminal of an input transistor, wherein the input transistor is configured to generate an output data signal at an output terminal based on the input data signal; and applying a first bias voltage to a first over-voltage protection transistor coupled in series with the input transistor between the output terminal and a voltage rail, wherein the first bias voltage is based on a supply voltage at the output terminal, and wherein the first bias voltage biases the first over-voltage protection transistor to prevent over-voltage stress to the first over-voltage protection transistor and the input transistor.

Another aspect of the disclosure relates to an apparatus including means for applying an input data signal to a control terminal of an input transistor, wherein the input transistor is configured to generate an output data signal at an output terminal based on the input data signal; and means for applying a first bias voltage to a first over-voltage protection transistor coupled in series with the input transistor between the output terminal and a voltage rail, wherein the first bias voltage is based on a supply voltage at the output terminal, and wherein the first bias voltage biases the first over-voltage protection transistor to prevent over-voltage stress to the first over-voltage protection transistor and the input transistor.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

Figure 1:
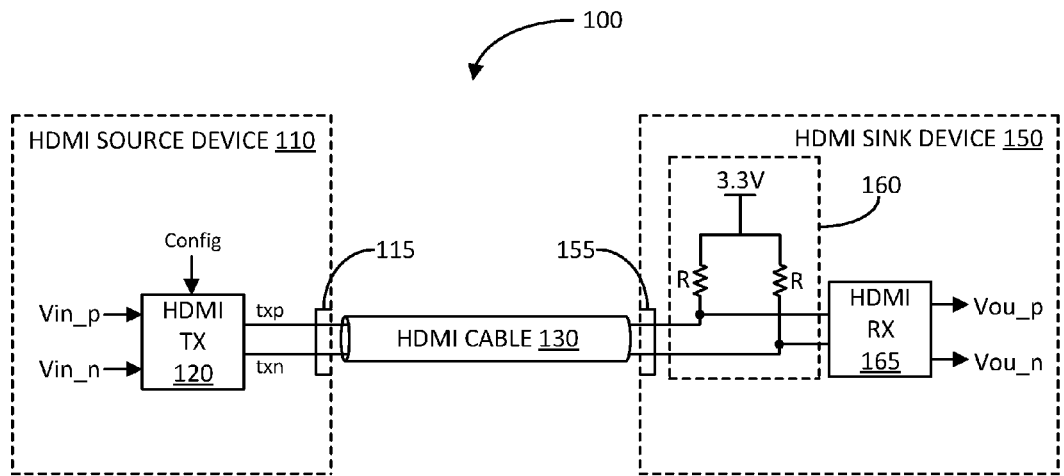
FIG. 1 illustrates a block diagram of an exemplary communication system in accordance with an aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

High-Definition Multimedia Interface (HDMI) is a widely used interface for transmission of multimedia data (e.g., video and/or audio) from an HDMI data source (e.g., a digital video recorder (DVR), optical disc player, smart phone, etc.) to an HDMI data sink (e.g., a television, monitor, projector, DVR, etc.). An HDMI data source transmits multimedia data to an HDMI data sink via an HDMI cable. Typically, one end of the HDMI cable is connected to an HDMI port at the HDMI data source. The other end of the HDMI cable is connected to an HDMI port at the HDMI data sink.

As indicated above, some HDMI data sources have small form factors, such as smart phones. Such small devices often do not have the space to accommodate multiple data ports, such as a Universal Serial Bus (USB) port and an HDMI port. Accordingly, recently a bridge chip has been introduced to operate a USB port as an HDMI port. This allows a small form factor device to be implemented with fewer ports, such as a single USB port, and provide it the capability of transmitting HDMI data to an HDMI source via the USB port.

In a typical HDMI source to HDMI sink connection, the HDMI data sink provides an external supply voltage for the transmit driver of the HDMI data source via the HDMI cable. The external supply voltage is substantially 3.3V at the HDMI data sink. However, the bridge chip provides an external supply voltage of substantially 1.8V. Thus, to accommodate the two different supply voltage scenarios, an HDMI data source may include a transmit driver designed to operate under the 1.8V supply voltage, and another transmit driver designed to operate under 3.3V supply voltage. However, providing an HDMI data source with two types of transmit drivers is costly, more complex, and generally inconvenient.

Accordingly, an aspect of the disclosure is to provide an HDMI transmit driver that is capable of operating under a wide variety of external supply voltages, including the 3.3V provided by an HDMI data sink and the 1.8V provided by a bridge chip. The term "external" in external supply voltage is that the supply voltage is generated external to the transmit driver.

Because of high data rates used in the transmission of HDMI data from a source to a sink, such HDMI transmit driver should use thin-oxide transistors to handle, for example, the six (6) gigabits per second (Gbps) data rate. However, the safe maximum voltage across any terminal of such thin-oxide transistors is typically low, e.g., 1.0V. Thus, the HDMI transmit driver described herein provides over-voltage protection transistors that are biased with voltages derived from the external supply voltage received via the differential output of the transmit driver. Accordingly, the HDMI transmit driver includes circuitry for setting the bias voltages for the protection transistors based on which external supply voltage is being used.

Additionally, the HDMI transmit driver uses internal supply voltages from the host HDMI source device. To operate properly (referred to herein as "functional operation"), the HDMI transmit driver uses the internal supply voltages and external supply voltage from either the HDMI data sink (e.g., 3.3V) or the bridge chip (1.8V), depending on the configuration of the HDMI source device. The internal and external supply voltages may be available to the HDMI transmit driver at different times. Thus, the HDMI transmit driver is configured to operate the transistors in safe regions based on different power-on-sequences of the internal and external supply voltages.

Additionally, the HDMI transmit driver includes an impedance adjusting circuit for setting an output impedance of the transmit driver using a control signal. Further, the HDMI transmit driver includes an emphasis equalizer for providing a configurable degree of emphasis to the transmit output signal, whereby the emphasis equalizer includes over-voltage protection transistors biased with voltages based on the external supply voltage (e.g., 3.3V or 1.8V).

The following provides an example of a transmit driver that implements the aforementioned concepts.

FIG. 1 illustrates a block diagram of an exemplary HDMI communication system 100 in accordance with an aspect of the disclosure. The HDMI communication system 100 pertains to when an HDMI transmit driver disclosed herein is configured to operate under an external 3.3V supply voltage provided by an HDMI sink.

In particular, the HDMI communication system 100 includes an HDMI data source device 110 coupled to an HDMI data sink device 150 via an HDMI cable 130. The HDMI source device 110 includes an HDMI port 115 coupled to an end of the HDMI cable 130. Similarly, the HDMI sink device 150 includes an HDMI port 155 coupled to the other end of the HDMI cable 130.

The HDMI source device 110 includes an HDMI transmit (TX) driver 120 (a.k.a., a transmitter) configured to receive an input differential data signal Vin_p/Vin_n, and generate a transmit differential data signal txp/txn based on the input differential data signal Vin_p/Vin_n. The HDMI transmit driver 120 receives an external supply voltage from 3.3V voltage source at the HDMI sink device 150 via the HDMI cable 130. Since the HDMI transmit device 120 is configured to operate under different supply voltages, the HDMI transmit device 120 is configured to receive a configuration signal "Config" indicating the external supply voltage configuration under which to operate. In this example, the Config signal indicates that the HDMI transmit driver 120 is to operate based on a 3.3V external supply voltage source. The Config signal may be generated by firmware in the HDMI source device 110.

The HDMI sink device 150 includes a supply voltage generator 160 including a 3.3V source and a pair of resistors R coupled to differential data transmission lines of the HDMI cable 130. The supply voltage 3.3V is sent to the HDMI transmit driver 120 via the pair of resistors R and the differential transmission lines of the HDMI cable 130. Similarly, the transmit differential signal txp/txn is transmitted from the HDMI source device 110 to the HDMI sink device 150 via the differential transmission lines of the HDMI cable 130. The HDMI sink device 150 further includes an HDMI receiver (RX) 165 configured to receive the transmit differential signal txp/txn, and generate therefrom an output differential signal Vou_p/Vou_n.

Figure 2:
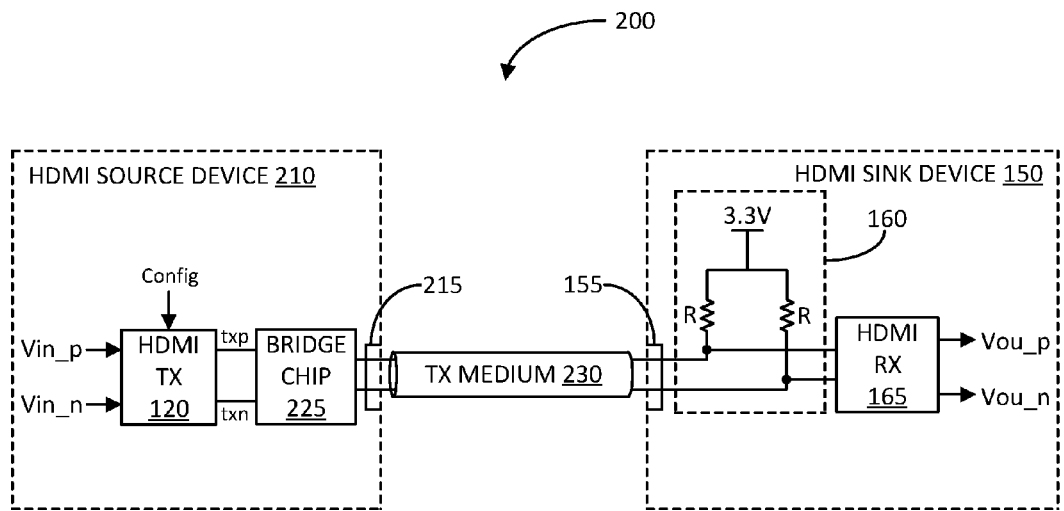
FIG. 2 illustrates a block diagram of another exemplary communication system in accordance with another aspect of the disclosure.

FIG. 2 illustrates a block diagram of an exemplary HDMI communication system 200 in accordance with another aspect of the disclosure. The HDMI communication system 200 pertains to when an HDMI transmit driver disclosed herein is configured to operate under an external 1.8V supply voltage provided by a bridge chip.

In particular, the system 200 includes an HDMI data source device 210 coupled to the HDMI data sink device 150 via a transmission medium 230. The HDMI source device 210 includes a non-HDMI port 215 (e.g., a USB port) coupled to an end of the transmission medium 230. Similarly, the HDMI sink device 150 includes the HDMI port 155 coupled to the other end of the transmission medium 230.

The HDMI source device 210 includes the HDMI transmit driver 120 previously discussed. In this configuration, the HDMI transmit driver 120 receives a 1.8V supply voltage from a bridge chip 225 located between the HDMI transmit driver 120 and the non-HDMI port 215. The bridge chip 225 converts the 3.3V supply voltage received from the HDMI sink device 150 via the transmission medium 230 to a 1.8V supply voltage for use by the transmit driver 120. In this regard, the Config signal received by the HDMI transmit driver 120 indicates that the HDMI transmit driver is to operate under a 1.8V supply voltage. The transmit differential signal txp/txn generated by the HDMI transmit driver 120 is sent to the HDMI sink device 150 via the bridge chip 225, non-HDMI port 215, and transmission medium 230.

Figure 3:
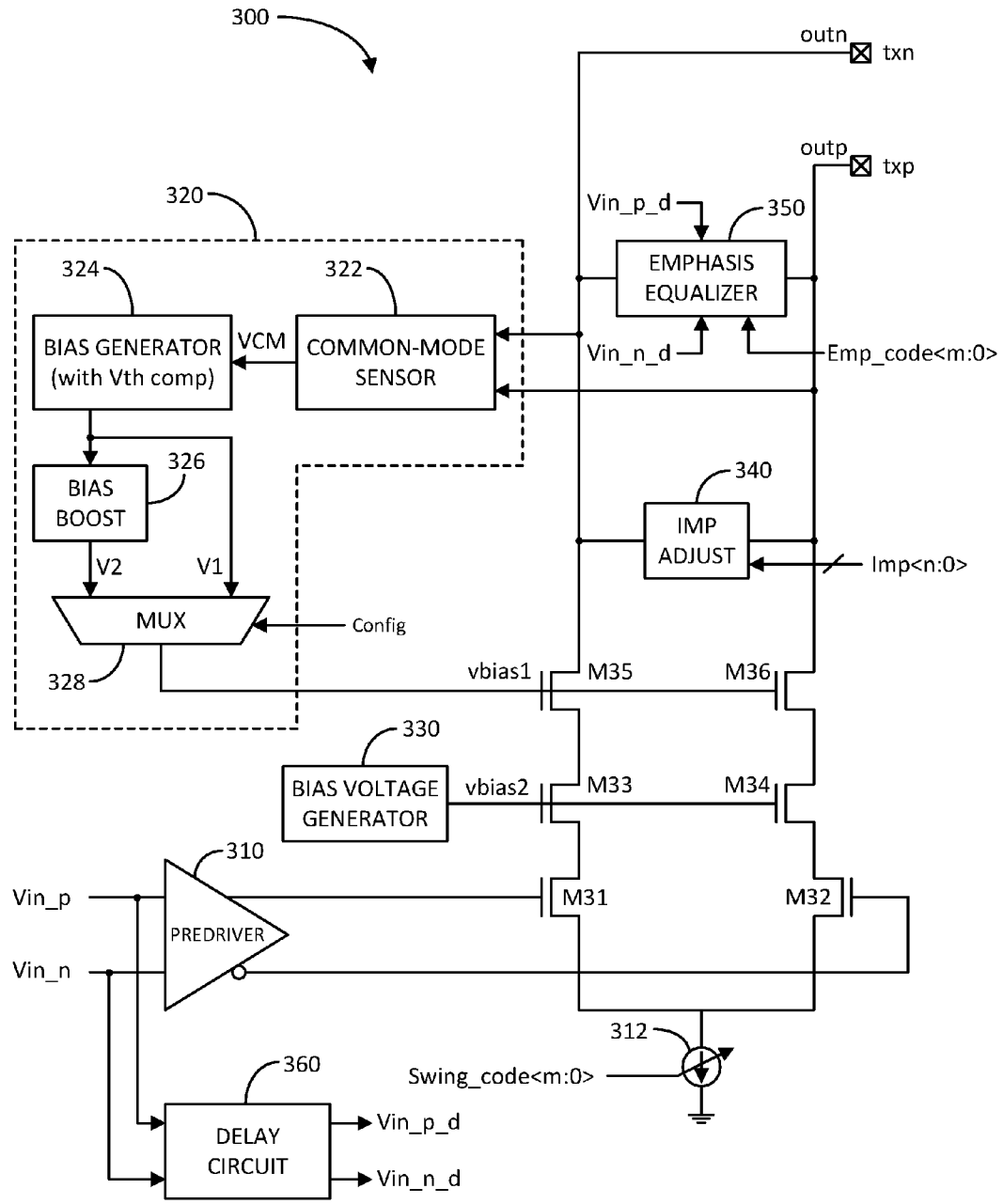
FIG. 3 illustrates a schematic diagram of an exemplary transmit driver in accordance with another aspect of the disclosure.

FIG. 3 illustrates a schematic diagram of an exemplary HDMI transmit driver 300 in accordance with another aspect of the disclosure. The HDMI transmit driver 300 may be an exemplary detailed implementation of the HDMI transmit driver 120 previously discussed.

In particular, the HDMI transmit driver 300 includes a predriver 310 configured to process (e.g., amplify) an input differential data signal Vin_p/Vin_n. The processed input differential signal is applied to respective control terminals (e.g., gates) of input differential transistors M31 and M32. Transistors M31 and M32 may each be configured as an n-channel metal oxide semiconductor (NMOS) field effect transistor (FET). Additionally, to achieve high data transmission rates (e.g., six (6) Gbps), the transistors M31 and M32 are each configured to have a relatively thin gate oxide. Because of the thin-oxide, the transistors M31 and M32 may be operated safely with a voltage across any terminal of no more than 1.0V.

Based on the configuration, the HDMI transmit driver 300 may receive an external supply voltage at output terminals outp and outn from, for example, a 3.3V supply voltage source as discussed in regards to communication system 100 or a 1.8V supply voltage source as discussed in regards to communication system 200. Because of the relatively high supply voltage (e.g., as high as substantially 3.3V or 1.8V) and the low voltage rating (e.g., 1.0V) of the input transistors M31 and M32, the HDMI transmit driver 300 further includes over-voltage protection transistors M33-M36. Transistors M33-M36 may each be configured as an NMOS FET. Additionally, as transistors M33-M36 remain substantially static (e.g., biased with substantially constant bias voltages vbias1 and vbias2), they may each be configured to have a relatively thick gate oxide without affecting the high data rate performance of the transmit driver 300. For example, because of the thicker oxide, the transistors M33-M36 may be operated safely with a voltage across any terminal of no more than 2.0V.

The transmit driver 300 includes a configurable current source 312 coupled between the input transistors M31 and M32 and a lower voltage rail (e.g., ground). Accordingly, the transistors M35, M33, and M31 are coupled in series between a negative output terminal outn and the current source 312. Similarly, the transistors M36, M34, and M32 are coupled in series between a positive output terminal outp and the current source 312.

The current source 312 is configured to receive a current setting signal Swing_code<m:0> based on the Config signal for setting the current through the transistors (M35, M33, and M31) and (M36, M34, and M32). The Swing_code<m:0> controls the swing of the output (transmit) differential signal txp/txn generated by the transmit driver 300. The signal Swing_code<m:0> and the resulting current may be different based on the configuration of the transmit driver 300 (e.g., whether it is configured to receive a supply voltage from a 3.3V supply voltage source or a 1.8V voltage supply source).

The HDMI transmit driver 300 includes a first bias voltage generator 320 for generating a first bias voltage vbias1 for the control terminals (e.g., gates) of transistors M35 and M36, and a second bias voltage generator 330 for generating a second bias voltage vbias2 for the control terminals (e.g., gates) of transistors M33 and M34.

As previously discussed, input transistors M31 and M32 are thin-oxide devices; and thus, can only tolerate a maximum voltage of 1.0V across any terminal. Accordingly, one objective of the second bias voltage generator 330 is to generate the bias voltage vbias2 such that the drains of the input transistors M31 and M32 are kept slightly below 1.0V. As the voltage at the gates of transistors M33 and M34 are a threshold voltage (e.g., 0.4V) above the voltage at the drains of transistors M31 and M32, the second bias voltage generator 330 is configured to generate vbias2 at a substantially constant voltage of approximately 1.3V to 1.4V. Further, the second bias voltage generator 330 includes threshold voltage compensation to generate the second bias voltage vbias2 so that the voltage at the drains of transistors M31 and M32 is kept slightly below 1.0V even though the threshold voltages of the devices vary due to process variation.

Also, as previously discussed, the transistors M33-M36 are thick-oxide devices; and thus, can tolerate a maximum voltage of 2.0V across any terminal. Accordingly, one objective of the first bias voltage generator 320 is to generate the first bias voltage vbias1 such that the voltage across any terminal of transistors M33-M36 is kept below 2.0V for the case where the supply voltage at the output terminals outp and outn is as high as 3.3V or 1.8V. In this regard, the first bias voltage generator 320 generates the bias voltage vbias1 based on the supply voltage at the output terminals outp and outn.

For the case where the supply voltage at the output terminals outp/outn is as high as 3.3V (or slightly lower due to IR loses across the resistors R at the HDMI data sink), the first bias voltage generator 320 is configured to generate vbias1 at substantially 1.9V. In such case, the sources of transistors M35 and M36 are subjected to a voltage being a threshold voltage below 1.9V, e.g., around 1.5V. Thus, the voltage across the drain and source of transistors M33 and M34 is around 0.5V to 0.6V; thereby keeping these transistors M33 and M34 safe from an over-voltage of greater than 2.0V.

Again, as the sources of transistors M35 and M36 are subjected to a voltage of approximately 1.5V, and the voltage at the output terminals is at maximum 3.3V, the voltage at the drain and source of transistors M35 and M36 is substantially 1.8V or less; thereby keeping these transistors safe from an over-voltage of greater than 2.0V.

For the case where the supply voltage at the output terminals outp/outn is as high as substantially 1.8V, the first bias voltage generator 320 is configured to generate vbias1 at approximately 1.6V. In such case, the sources of transistors M35 and M36 are subjected to a voltage of a threshold voltage below 1.6V, e.g., around 1.2V. Thus, the voltage across the drain and source of transistors M33 and M34 is around 0.4V; thereby keeping these transistors safe from an over-voltage of 2.0V.

Again, as the sources of transistors M35 and M36 are subjected to a voltage of approximately 1.2V, and the voltage at the output terminals is at maximum 1.8V, the voltage across the drains and sources of transistors M35 and M36 is around 0.6V; thereby keeping these transistors safe from an over-voltage of 2.0V.

To generate the bias voltage vbias1 based on the supply voltage at the output terminals outp/outn, the first bias voltage generator 320 includes a common-mode sensor 322, a bias generator (with threshold compensation) 324, a bias boost circuit 326, and a multiplexer 328.

The common-mode sensor 322 is configured to generate a common mode voltage VCM based on the supply voltage at the output terminals outp and outn of the transmit driver 300. For example, for the case where the supply voltage is 3.3V, the common-mode sensor 322 is configured to generate VCM at substantially 2.7V. For the case where the supply voltage is 1.8V, the common-mode sensor 322 is configured to generate VCM at substantially 1.2V.

The bias generator 324 is configured to generate a first unselected bias voltage V1 based on the common mode voltage VCM. For the case where the external supply voltage is 3.3V, the first unselected bias voltage V1 is approximately 2.7V. For the case where the external supply voltage is 1.8V, the first unselected bias voltage V1 is approximately 1.2V. The bias generator 324 includes threshold compensation to generate V1 to track threshold variation of devices due to process variation.

The bias boost circuit 326 is configured to boost the first unselected bias voltage V1 to generate a second unselected bias voltage V2 (e.g., V2>V1). The second unselected bias voltage V2 is only relevant for the case where the external supply voltage is 1.8V. In such case, the second unselected bias voltage V2 is approximately 1.6V.

The multiplexer 328 outputs either the first unselected bias voltage V1 or the second unselected bias voltage V2 based on the Config signal. If the Config signal indicates that the external supply voltage source is a 3.3V source, the multiplexer 328 outputs the first unselected bias voltage V1 (e.g., 1.9V) as the bias voltage vbias1 for the gates of transistors M35 and M36. If, on the other hand, the Config signal indicates that the external supply voltage source is a 1.8V source, the multiplexer 328 outputs the second unselected bias voltage V2 (e.g., 1.6V) as the bias voltage vbias1 for the gates of transistors M35 and M36.

For output impedance control, the transmit driver 300 further includes an impedance adjusting circuit 340 coupled to the positive and negative output terminals outp and outn. The impedance adjusting circuit 340 is configured to receive an impedance control signal Imp<n:0> for setting the output impedance of the transmit driver 300. As discussed in more detail herein, the impedance adjusting circuit 340 may be configured as a variable resistor coupled between the output terminals outp and outn.

Further, to provide emphasis equalization to the output differential signal txp/txn, the transmit driver 300 further includes a delay circuit 360 and an emphasis equalizer 350. The delay circuit 360 is configured to receive the input differential signal Vin_p/Vin_n and generate therefrom, a delayed input differential signal Vin_p_d/Vin_n_d. For example, the delay circuit 360 may be configured to delay the input differential signal Vin_p/Vin_n by an amount of 0.5 to 1.0 unit interval (UI), as desired. The emphasis equalizer 350 is configured to receive the delayed input differential signal Vin_p_d/Vin_n_d and an emphasis control signal Emp_code<m:0>, and apply emphasis equalization to the output differential signal txp/txn based on these received signals. The emphasis control signal Emp_code<m:0> controls the amount of emphasis applied to the output differential signal txp/txn (e.g., the slope of the transitions of the output differential data signal txp/txn).

Figure 4:
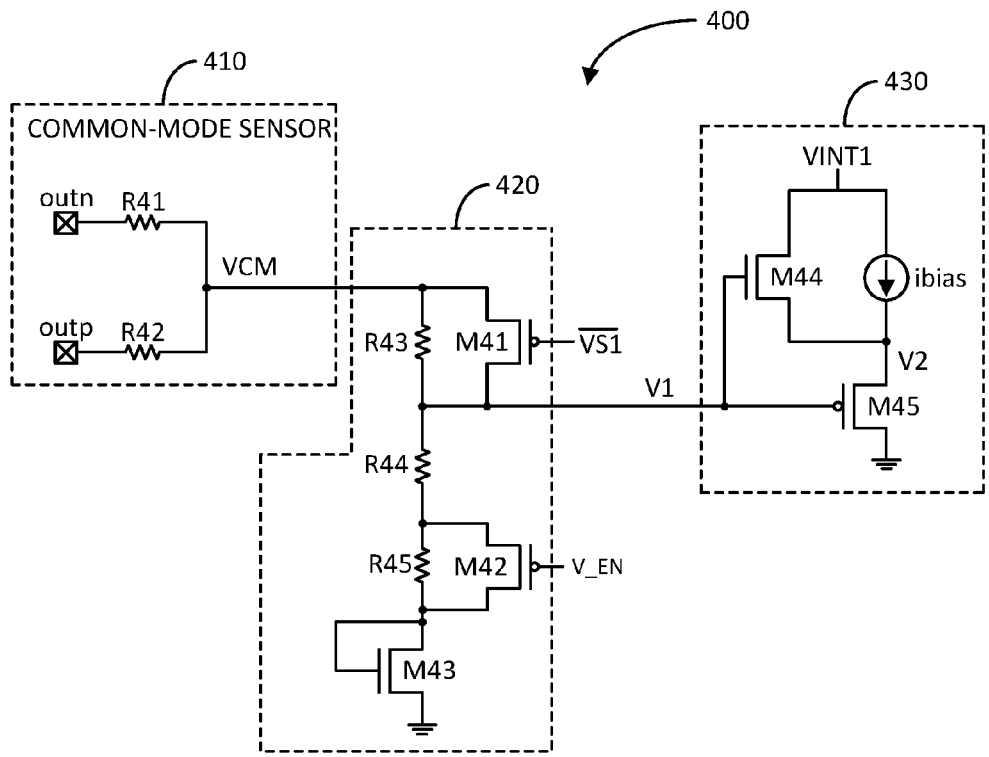
FIG. 4 illustrates a schematic diagram of an exemplary common-mode sensor, bias generator (with threshold compensation), and bias boost circuit in accordance with another aspect of the disclosure.

FIG. 4 illustrates a schematic diagram of an exemplary common-mode sensor 410, bias generator (with threshold compensation) 420, and bias boost circuit 430 in accordance with another aspect of the disclosure. The common-mode sensor 410, bias generator (with threshold compensation) 420, and bias boost circuit 430 may be exemplary detailed implementations of the common-mode sensor 320, bias generator (with threshold compensation) 324, and bias boost circuit 326 previously discussed.

The common-mode sensor 410 includes a pair of resistors R41 and R42 with respective first ends coupled to the output terminals outn and outp of the transmit driver 300, and respective second ends coupled together at a common node. The resistors R41 and R42 average the voltages at the output terminals outn and outp to generate the sensed common mode voltage VCM at the common node.

The bias generator 420 includes a voltage divider having resistors R43, R44, and R45 coupled in series with a diode-connected transistor M43 between the common node and the lower voltage rail (e.g., ground). A transistor M41 (e.g., a p-channel metal oxide semiconductor (PMOS) FET) is coupled in parallel with resistor R43, and includes a control terminal (e.g., gate) configured to receive a voltage $\overline{VS1}$ based on the common mode voltage VCM and an internal voltage VS2 (generated at the HDMI data source device).

For instance, in functional mode, the internal voltage VS2 may be in a voltage domain with low and high logic voltages being substantially 0V and 1.65V/1.8V. The voltage $\overline{VS1}$ may be in a voltage domain with low and high logic voltages being substantially VCM—2V (breakdown voltage of thick-oxide FET) and VCM. In functional mode, the voltage $\overline{VS1}$ logically follows a voltage $\overline{VS2}$, which is the complementary of voltage VS2. In functional mode, the voltage VS2 is a low logic voltage if the Config signal indicates that the supply voltage received is from an external 3.3V supply voltage source, and a high logic voltage if the Config signal indicates that the supply voltage received is from an external 1.8V supply voltage source.

The bias generator 420 further includes another transistor M42 (e.g., a PMOS FET) coupled in parallel with resistor R43. The transistor M42 includes a control terminal (e.g., gate) configured to receive a driver enable signal or voltage V_EN. The driver enable voltage V_EN is logically high if the transmit driver 300 is enabled (e.g., the current source 312 is generating current in accordance with the Swing_code<m:0> signal). Conversely, the driver enable voltage V_EN is logically low if the transmit driver 300 is not enabled (e.g., the current source 312 is off). The first unselected bias voltage V1 is generated at a node between resistors R43 and R44. The diode-connected transistor M43 provides threshold voltage compensation to the first unselected bias voltage V1 (e.g., the voltage V1 varies as a function of the threshold voltage of transistor M43).

The bias boost circuit 430 includes a current source ibias and a transistor (PMOS) M45 coupled in series between an internal voltage rail VINT1 and the lower voltage rail (e.g., ground). The bias boost circuit 430 further includes a transistor M44 coupled between the internal voltage rail VINT1 and transistor M45. The first unselected bias voltage V1 is applied to the gates of transistors M44 and M45. The second unselected bias voltage V2 is generated at the upper terminal (e.g., source) of transistor M45, which is substantially a threshold voltage higher than the first unselected bias voltage V1.

The operations of the bias generator 420 and the bias boost circuit 430 are discussed below in more detail with reference to FIGS. 9A-9H.

Figure 5:
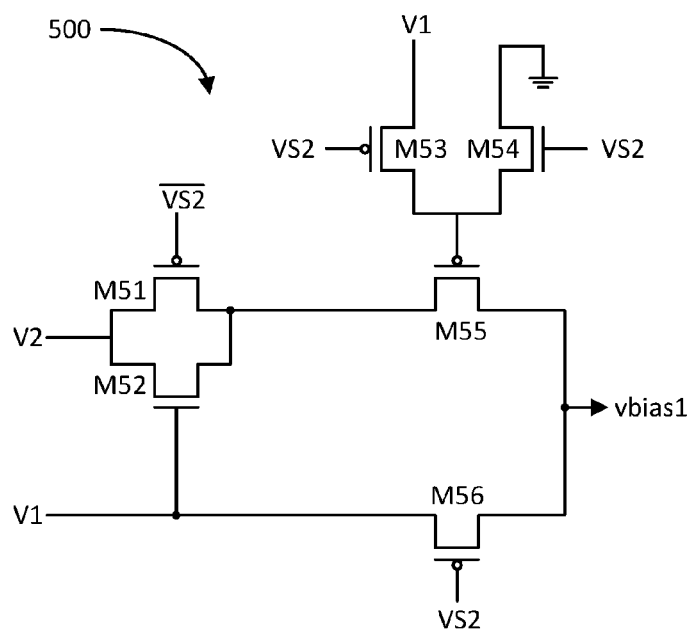
FIG. 5 illustrates a schematic diagram of an exemplary multiplexer in accordance with another aspect of the disclosure.

FIG. 5 illustrates a schematic diagram of an exemplary multiplexer 500 in accordance with another aspect of the disclosure. The multiplexer 500 may be an exemplary detailed implementation of the multiplexer 328 previously discussed.

The multiplexer 500 includes a transistor M51 (e.g., a PMOS FET) coupled in parallel with a transistor M52 (e.g., an NMOS FET). The transistors M51 and M52 include a first set of terminals coupled together and configured to receive the second unselected bias voltage V2. Transistor M51 includes a control terminal (e.g., gate) configured to receive the internal voltage $\overline{VS2}$. Transistor M52 includes a control terminal (e.g., gate) configured to receive the first unselected bias voltage V1. The transistors M51 and M52 include a second set of terminals coupled together.

The multiplexer 500 includes a third transistor M53 (e.g., a PMOS FET) coupled in series with a fourth transistor M54 (e.g., an NMOS FET) between the node that produces the first unselected bias voltage V1 and the lower voltage rail (e.g., ground). The transistors M53 and M54 include control terminals (e.g., gates) configured to receive the internal voltage VS2.

The multiplexer 500 further includes a fifth transistor M55 (e.g., a PMOS FET) coupled between the second set of terminals of transistors M51 and M52 and the output of the multiplexer (e.g., where the bias voltage vbias1 is generated). The transistor M55 includes a control terminal (e.g., gate) coupled to the node between transistors M53 and M54. Additionally, the multiplexer 500 includes a sixth transistor M56 (e.g., a PMOS FET) coupled between the node at which the first unselected bias voltage V1 is generated (as well as the gate of transistor M52) and the output of the multiplexer. The transistor M56 includes a control terminal (e.g., gate) configured to receive the internal voltage VS2.

The operation of the multiplexer is discussed below in more detail with reference to FIGS. 9A-9H.

Figure 6:
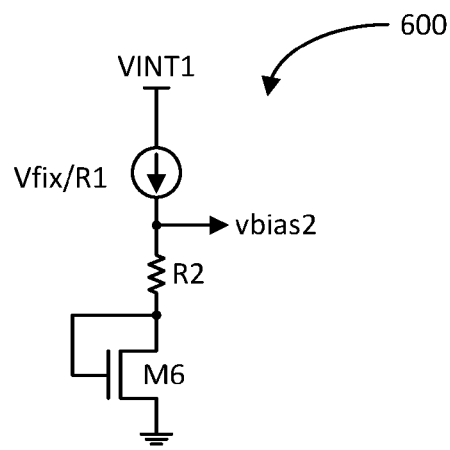
FIG. 6 illustrates a schematic diagram of an exemplary bias voltage generator in accordance with another aspect of the disclosure.

FIG. 6 illustrates a schematic diagram of an exemplary bias voltage generator 600 in accordance with another aspect of the disclosure. The bias voltage generator 600 may be an exemplary detailed implementation of the second bias voltage generator 330 previously discussed.

The bias voltage generator 600 includes a current source Vfix/R1, resistor R2, and diode-connected transistor M6 (e.g., an NMOS FET) coupled in series between an internal voltage rail VINT1 and the lower voltage rail (e.g., ground). The second bias voltage vbias2 is generated at a node between the current source Vfix/R1 and resistor R2. The diode-connected transistor M6 provides threshold voltage compensation to the bias voltage vbias2 (e.g., the voltage V2 varies as a function of the threshold voltage of transistor M6). The second bias voltage vbias2 is also substantially process independent as it depends on a resistor ratio R2/R1. As discussed above, the bias voltage generator 600 may be configured to generate the bias voltage vbias2 to be substantially 1.4V to protect the input transistors M31 and M32 from over-voltage stress of more than 1.0V across any of their terminals.

Figure 7:
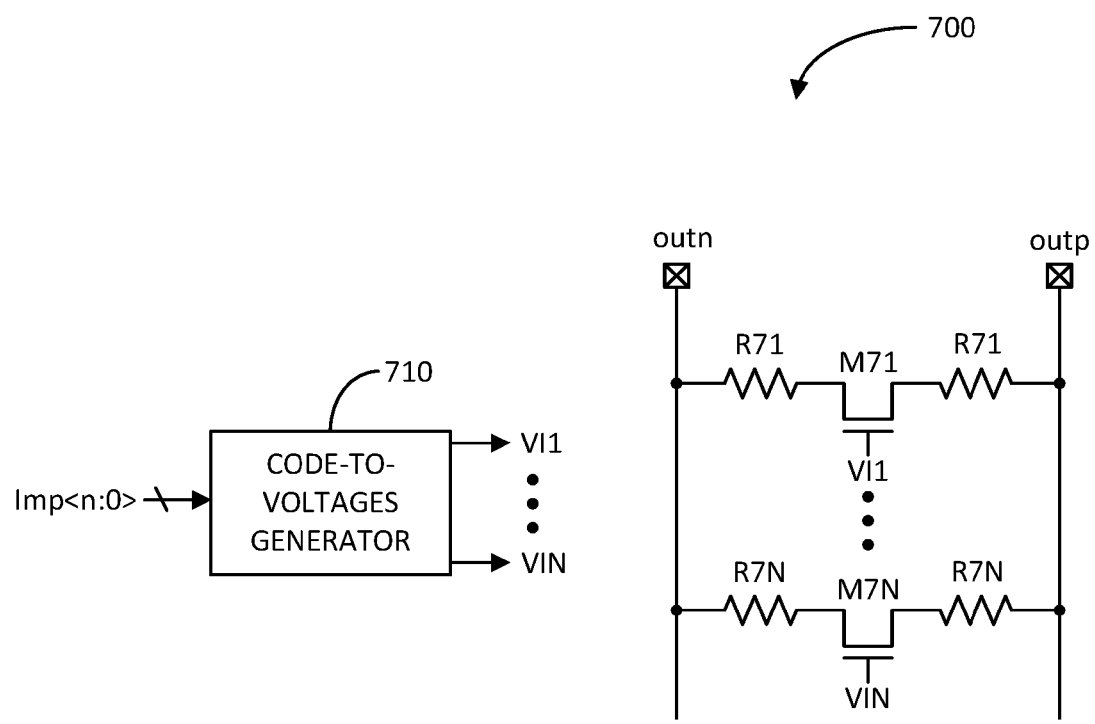
FIG. 7 illustrates a schematic diagram of an exemplary impedance adjusting circuit in accordance with another aspect of the disclosure.

FIG. 7 illustrates a schematic diagram of an exemplary impedance adjusting circuit 700 in accordance with another aspect of the disclosure. The impedance adjusting circuit 700 may be an exemplary more detailed implementation of the impedance adjusting circuit 340 previously discussed.

In particular, the impedance adjusting circuit 700 includes a variable resistor configured as a set of N selectable resistor branches coupled between the output terminals outn and outp of the transmit driver 300. Each selectable resistor branch includes a switching device (e.g., an NMOS FET) coupled between two resistors having substantially the same resistance.

For instance, as illustrated, a first selectable resistor branch includes first resistor R71, transistor M71, and second resistor R71 coupled in series between the output terminals outn and outp of the transmit driver 300. Similarly, an Nth selectable resistor branch includes first resistor R7N, transistor M7N, and second resistor R7N coupled in series between the output terminals outn and outp. The on and off states of the transistors M71 to M7N is controlled by gate voltages VI1 to VIN, respectively.

The impedance adjusting circuit 700 includes a code-to-voltage generator 710 configured to receive the impedance control signal Imp<n:0> and generate therefrom, the set of gate voltages VI1 to VIN. For example, if the control signal Imp<n:0> calls for a relatively high output impedance, the code-to-voltage generator 710 generates the set of gate voltages VI1 to VIN to turn on a relatively small number of the transistors M71 to M7N. On the other hand, if the control signal Imp<n:0> calls for a relatively low output impedance, the code-to-voltage generator 710 generates the set of gate voltages VI1 to VIN to turn on a relatively large number of the transistors M71 to M7N.

Figure 8:
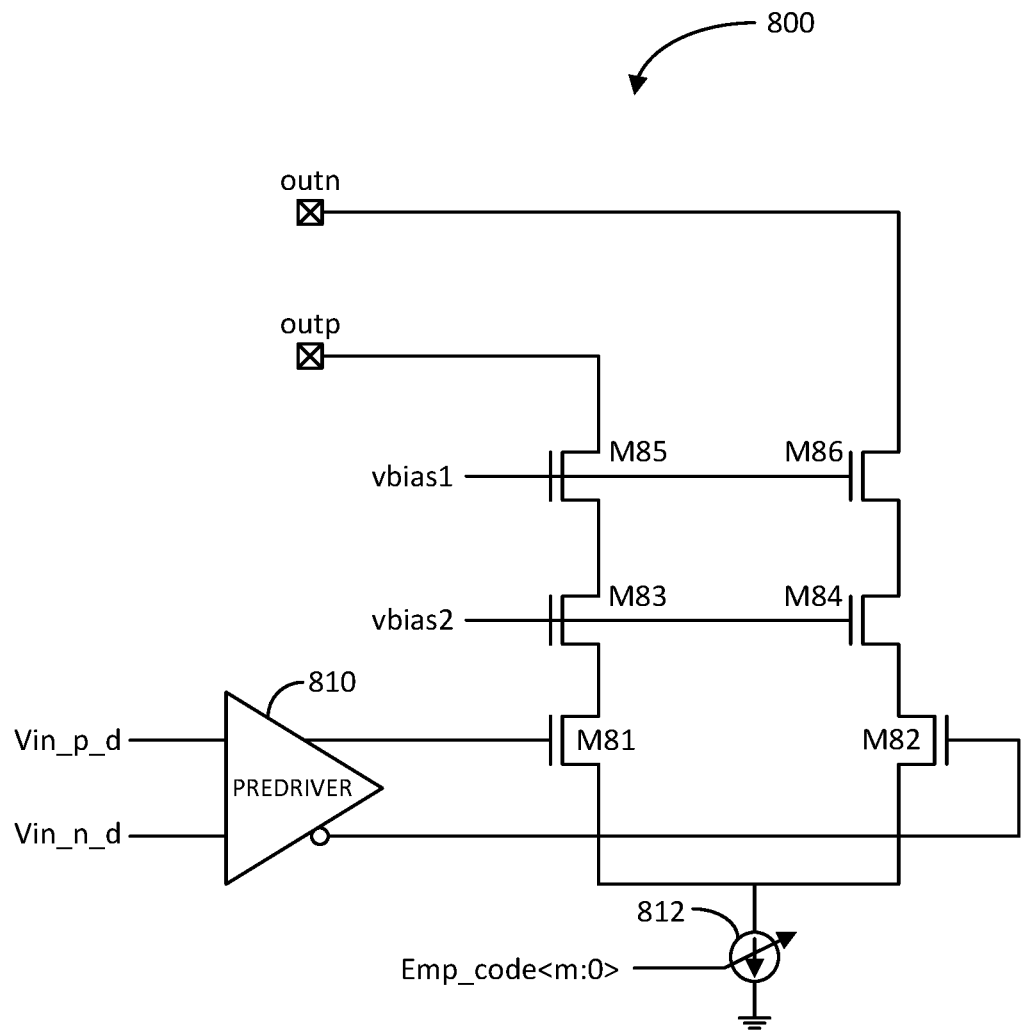
FIG. 8 illustrates a schematic diagram of an exemplary emphasis equalizer in accordance with another aspect of the disclosure.

FIG. 8 illustrates a schematic diagram of an exemplary emphasis equalizer 800 in accordance with another aspect of the disclosure. The emphasis equalizer 800 may be an exemplary detailed implementation of the emphasis equalizer 350 previously discussed.

The emphasis equalizer 800 includes a predriver 810 configured to process (e.g., amplifier) the delayed input differential signal Vin_p_d/Vin_n_d. The processed delayed input differential signal is applied to gates of input differential transistors M81 and M82 (e.g., NMOS FETs), respectively. The input differential transistors M81 and M82 may have relatively thin gate oxides similar to input differential transistors M31 and M32.

The emphasis equalizer 800 may be configured similar to the transmit driver 300, and includes over-voltage protection transistors M83-M86 (e.g., NMOS FETs) and a configurable current source 812. The transistors M83-M86 may have relatively thick gate oxides similar to transistors M33-M36. Transistors M85, M83, and M81 are coupled in series between the positive output terminal outp of the transmit driver 300 and the current source 812. Similarly, the transistors M86, M84, and M82 are coupled in series between the negative output terminal outn of the transmit driver 300 and the current source 812.

As discussed above, the input transistors M81 and M82 may be configured as thin-oxide devices, and the over-voltage protection transistors M83-M86 may be configured as thick-oxide devices. To protect these transistors from over-voltage conditions, similar to the transistors M31-M36 of the transmit driver 300, the first bias voltage vbias1 is applied to the gates of transistors M85 and M86, and the second bias voltage vbias2 is applied to the gates of transistors M83 and M84.

The degree of emphasis provided to the output differential signal txp/txn of the transmit driver 300 is controlled by the current generated through the transistors M81-M86 by the configurable current source 812. The emphasis control signal Emp_code<m:0> is applied to the configurable current source 812 to control the current through the transistors M81-M86; and thus, set the desired emphasis applied to the output differential signal txp/txn of the transmit driver 300.

FIGS. 9A-9H illustrate schematic diagrams of the bias generator 420, bias boost circuit 430, and multiplexer 500 in different power-on-sequence configurations in accordance with another aspect of the disclosure. These circuits are biased in a particular manner depending on the order in which the internal voltages (VINT1, VINT2, VS2 and $\overline{VS2}$) and the external supply voltage (3.3V or 1.8V and $\overline{VS1}$) are present. The purpose of the bias configuration is to appropriately generate the first bias voltage vbias1 under all voltage power-on-sequences in order to protect the transistors M31-M36 of the transmit driver 300 from over-voltage conditions.

Figure 9A:
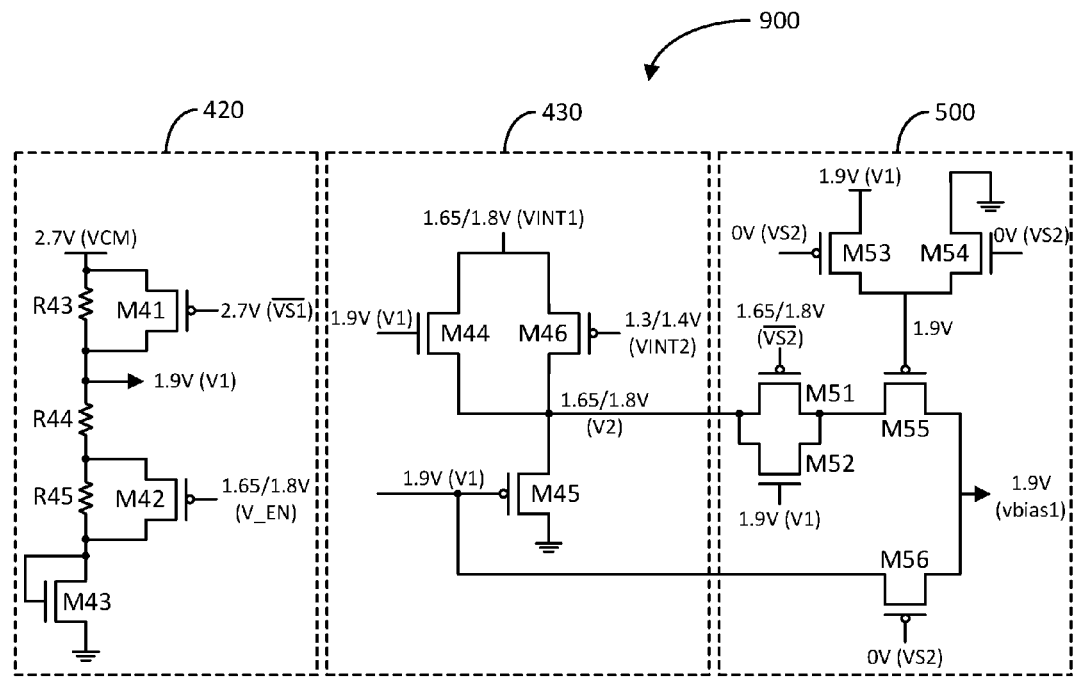
FIGS. 9A-9H illustrate schematic diagrams of the bias generator, bias boost circuit, and multiplexer in different exemplary power-on-sequence configurations in accordance with another aspect of the disclosure.

In particular, FIG. 9A pertains to a bias configuration 900 where the transmit driver 300 is in functional mode to generate the output transmit differential data signal txp/txn based on the input differential signal Vin_p/Vin_n. Additionally, the bias configuration 900 also pertains to the case where the Config signal indicates that the external supply voltage is provided by a 3.3V supply voltage source at the HDMI data sink device. In such configuration 900, the output terminals outp/outn of the transmit driver 300 are coupled to the external supply voltage source, the internal voltages are generated, and the configurable current source 312 is enabled.

Because the Config signal indicates that the external supply voltage source is the 3.3V source, the internal voltages VS2 and $\overline{VS2}$ are at low and high logic voltages (e.g., 0V and 1.65/1.8V), respectively. The other internal voltages VINT1 and VINT2 are at 1.65/1.8V and 1.3/1.4V, respectively. In functional mode, the voltage $\overline{VS1}$ is logically the same as the internal voltage $\overline{VS2}$, but in the VCM—2V (breakdown voltage of thick-oxide FET) to VCM voltage domain. Since the internal voltage $\overline{VS2}$ is at a high logic voltage, $\overline{VS1}$ is at a high logic voltage at substantially VCM level (e.g., 2.7V).

With regard to the bias generator 420, the high logic voltage $\overline{VS1}$ at the gate of transistor M41 causes this transistor to turn off. Thus, the first unselected bias voltage V1 may be determined substantially by the following relationship:

$$V1 = VCM * \frac{R45 + R44}{R43 + R44 + R45} + 0.4 \text{ V}$$

The 0.4V in the above equation is the voltage across the diode-connected transistor M43. The resistors R43, R44, and R45 may be configured to generate the first unselected bias voltage V1 at substantially 1.9V.

With regard to the bias boost circuit 430, the first unselected bias voltage V1 is applied to the gates of transistors M44 and M45. Accordingly, the voltage V1 being at substantially 1.9V turns on NMOS transistor M44 and turns off PMOS transistor M45. The PMOS transistor M46 is an example of the current source ibias illustrated in FIG. 4, and includes a gate biased by internal voltage VINT2 at 1.3/1.4V. As a result, the second unselected bias voltage V2 is brought up substantially to the internal voltage VINT1 of 1.65/1.8V.

With regard to the multiplexer 500, the first unselected bias voltage V1 is also applied to the gate of NMOS transistor M52. The internal voltage $\overline{VS2}$ is applied to the gate of PMOS transistor M51. Since the voltage V1 is substantially at 1.9V, NMOS transistor M52 is turned on. Since the internal voltage $\overline{VS2}$ is at 1.65/1.8V, the PMOS transistor M51 is turned off. As a result, the second unselected bias voltage V2 at 1.65/1.8V is applied to the source of PMOS transistor M55 via NMOS transistor M52.

The first unselected bias voltage V1 is also applied to the source of PMOS transistor M53. The internal voltage VS2 is applied to the gates of PMOS transistor M53 and NMOS transistor M54. Since the internal voltage VS2 is at a low logic voltage of substantially 0V when the external supply voltage is at 3.3V, PMOS transistor M53 is turned on and NMOS transistor M54 is turned off. Accordingly, the first unselected bias voltage V1 at 1.9V is applied to the gate of PMOS transistor M55 via PMOS transistor M53. As a result, PMOS transistor M55 is turned off.

The first unselected bias voltage V1 is also applied to the source of PMOS transistor M56. The internal voltage VS2 is applied to the gate of PMOS transistor M56. Since the internal voltage VS2 is at a low logic voltage of substantially 0V when the external supply voltage is at 3.3V, PMOS transistor M56 is turned on. Accordingly, the first unselected bias voltage V1 is applied to the output of the multiplexer 500 via PMOS transistor M56 to generate the bias voltage vbias1 at substantially 1.9V. Since PMOS transistor M55 is turned off, the transistor M55 isolates the internal supply voltage rail VINT1 from the bias voltage Vbias1.

Figure 9B:
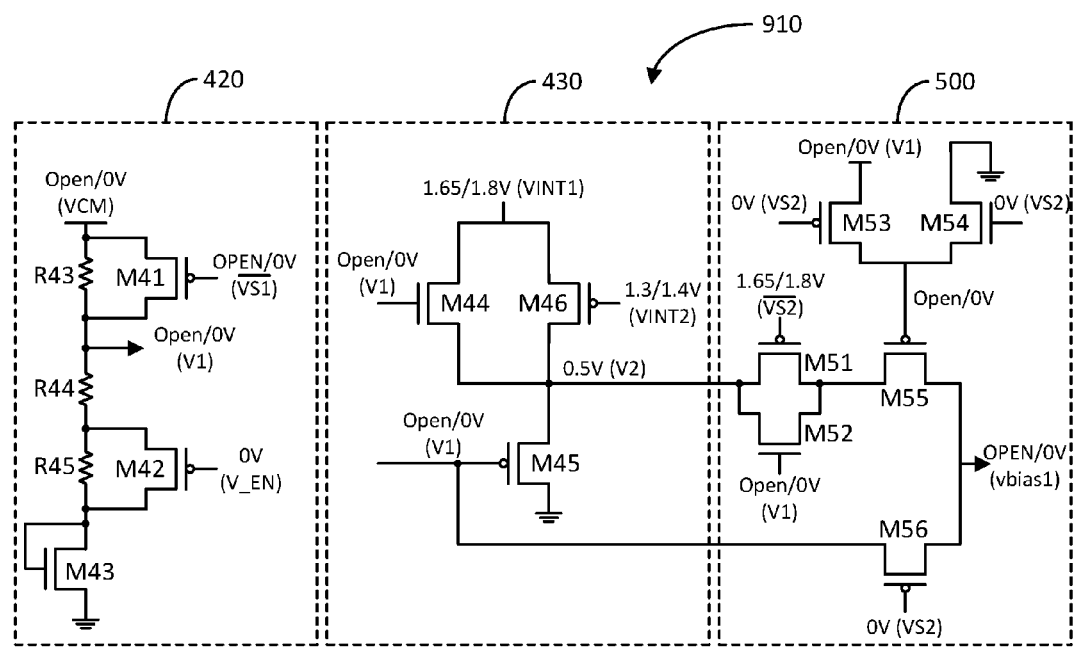

FIG. 9B pertains to a bias configuration 910 where the transmit driver 300 is not connected to the external supply voltage source, the transmit driver current source 312 is off, and the internal voltages are generated. Additionally, the bias configuration 910 also pertains to the case where the Config signal indicates that the external supply voltage is provided by a 3.3V supply voltage source at the HDMI data sink device. Accordingly, the bias configuration 910 pertains to the case where the HDMI data source device is not connected to HDMI data sink device. In such case, a signal detection circuit (not shown) may disable the configurable current source 312 of the transmit driver 300 in response to not detecting a supply voltage across the output terminals outp/outn of the transmit driver 300.

Because the Config signal indicates that the external supply voltage is provided by a 3.3V source, the internal voltages VS2 and $\overline{VS2}$ are at low and high logic voltages (e.g., 0V and 1.65/1.8V), respectively. The other internal voltages VINT1 and VINT2 are at 1.65/1.8V and 1.3/1.4V, respectively. The voltage $\overline{VS1}$ is substantially at VCM since a level shifter (not shown) for converting $\overline{VS2}$ to $\overline{VS1}$ is not operational when the current source 312 of the transmit driver 300 is off. In this case, VCM (as well as $\overline{VS1}$) are substantially open/0V as the output terminals outp and outn of the transmit driver 300 is not coupled to the 3.3 supply voltage source.

With regard to the bias generator 420, since VCM is an open/0V, there is no source voltage for generating the first unselected bias voltage V1. Accordingly, the first unselected bias voltage V1 is also at an open/0V.

With regard to the bias boost circuit 430, the first unselected bias voltage V1 is applied to the gates of transistors M44 and M45. Accordingly, the voltage V1 being at open/0V turns off NMOS transistor M44 and turns on PMOS M45. As a result, the second unselected bias voltage V2 may reach a small voltage of about 0.5V due to the current source transistor M46.

With regard to the multiplexer 500, the first unselected bias voltage V1 is also applied to the gate of NMOS transistor M52. The internal voltage $\overline{VS2}$ is applied to the gate of PMOS transistor M51. Since the voltage V1 is at an open/0V, NMOS transistor M52 is turned off. Since the internal voltage $\overline{VS2}$ is at 1.65/1.8V, the PMOS transistor M51 is also turned off. As a result, the second unselected bias voltage V2 at 0.5V is not applied to the source of PMOS transistor M55.

The first unselected bias voltage V1 is also applied to the source of PMOS transistor M53. The internal voltage VS2 is applied to the gates of PMOS transistor M53 and NMOS transistor M54. Since the first unselected bias voltage V1 is at an open/0V, there is no voltage source for the gate of PMOS transistor M55. As there is no voltage source for the source of PMOS transistor M55, the PMOS transistor M55 is turned off.

The first unselected bias voltage V1 is also applied to the source of PMOS transistor M56. The internal voltage VS2 is applied to the gate of PMOS transistor M56. Since the first unselected bias voltage V1 is at an open/0V, there is no voltage source for the PMOS transistor M56. Thus, the PMOS transistor M56 is also turned off. Since both the PMOS transistors M55 and M56 are turned off, the output of the multiplexer 500 produces an open/0V for the bias voltage Vbias1. This prevents any over-voltage stress upon transistors M31-M36 of the transmit driver 300 when the output terminals outp/outn are not coupled to a 3.3V supply voltage source.

Figure 9C:
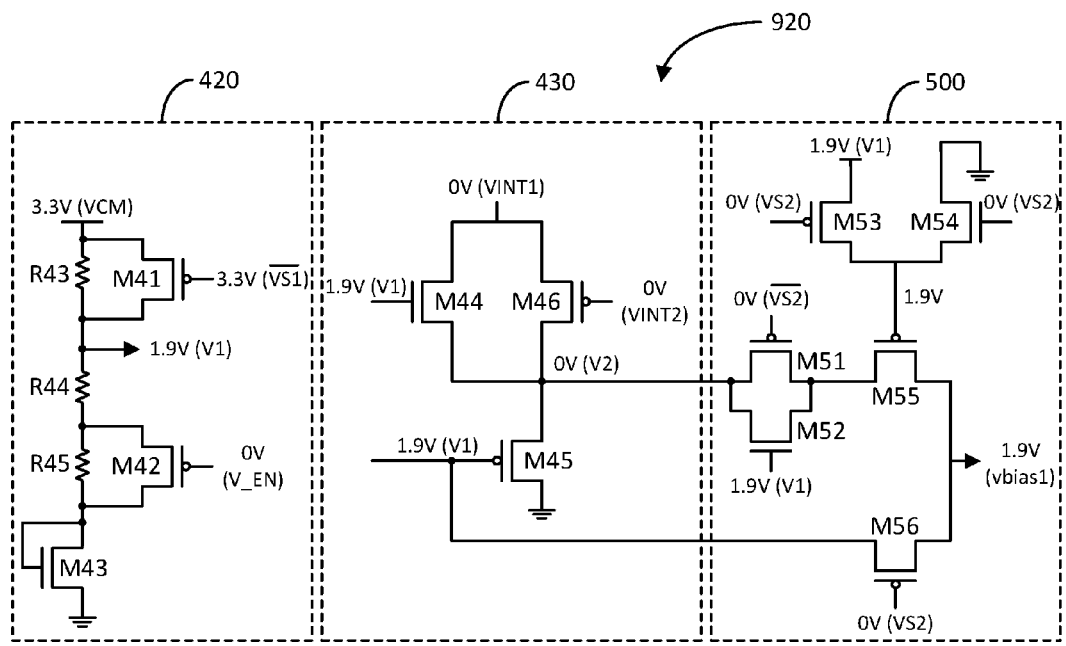

FIG. 9C pertains to a bias configuration 920 where the internal voltages VINT1, VINT2, VS1, $\overline{VS1}$, and V_EN have not been generated, the output terminals outp/outn of the transmit driver 300 is coupled to a 3.3 supply voltage source, and the configurable current source 312 is not producing current (e.g., V_EN is at a low logic voltage). Accordingly, the internal voltages VINT1, VINT2, VS1, $\overline{VS1}$, and V_EN are all at substantially 0V.

The voltage $\overline{VS1}$ is substantially at VCM since a level shifter (not shown) for converting $\overline{VS2}$ to $\overline{VS1}$ is not operational when the current source 312 of the transmit driver 300 is off. In this case, VCM (as well as $\overline{VS1}$) are at substantially 3.3V since the output terminals outp and outn of the transmit driver 300 are coupled to the 3.3 supply voltage source, and there is no IR losses occurring across the resistors R at the HDMI data sink devices as the current source 312 of the transmit driver 300 is off.

With regard to the bias generator 420, the high logic voltage $\overline{VS2}$ at the gate of transistor M41 causes this transistor to turn off. The low logic voltage of the driver enable signal V_EN causes PMOS transistor M42 to turn on, and short out resistor R45. Thus, the first unselected bias voltage V1 may be given substantially by the following relationship:

$$V1 = VCM * \frac{R44}{R43 + R44} + 0.4 \text{ V}$$

Again, the 0.4V in the above equation is the voltage across the diode-connected transistor M43. The resistors R43 and R44 may be configured to generate the first unselected bias voltage V1 at substantially 1.9V.

With regard to the bias boost circuit 430, the first unselected bias voltage V1 is applied to the gates of transistors M44 and M45. Since the internal supply voltage VINT1 is substantially at 0V, there is no voltage source for transistors M44 and M46. As a result, the second unselected bias voltage V2 is also at substantially 0V. Similarly, since the source of PMOS transistor M45 is at substantially 0V, the PMOS transistor M45 is also turned off.

With regard to the multiplexer 500, the first unselected bias voltage V1 is also applied to the gate of NMOS transistor M52. The internal voltage $\overline{VS2}$ is applied to the gate of PMOS transistor M51. Since the second unselected bias voltage V2 is at substantially 0V, there is no voltage source for the transistors M51 and M52. Accordingly, transistors M51 and M52 are turned off.

The first unselected bias voltage V1 is also applied to the source of PMOS transistor M53. The internal voltage VS2 is applied to the gates of PMOS transistor M53 and NMOS transistor M54. Since the internal voltage VS2 is at the logic low voltage of 0V, PMOS transistor M53 is turned on and NMOS transistor M54 is turned off. Accordingly, the first unselected bias voltage V1 at 1.9V is applied to the gate of PMOS transistor M55 via PMOS transistor M53. Because of this and the fact that transistors M51 and M52 are turned off, PMOS transistor M55 is turned off.

The first unselected bias voltage V1 is also applied to the source of PMOS transistor M56. The internal voltage VS2 is applied to the gate of PMOS transistor M56. Since the internal voltage VS2 is at a low logic voltage of substantially 0V, PMOS transistor M56 is turned on. Accordingly, the first unselected bias voltage V1 is applied to the output of the multiplexer 500 via PMOS transistor M56 to generate the bias voltage vbias1 at substantially 1.9V. Since PMOS transistor M55 is turned off, the transistor M55 isolates the internal supply voltage rail VINT1 from the bias voltage eVbias1. The bias voltage vbias1 being at 1.9V protects the transistors M31-M36 from over-voltage stress that would otherwise be caused by the 3.3V at the output terminals outp/outn of the transmit driver 300.

Figure 9D:
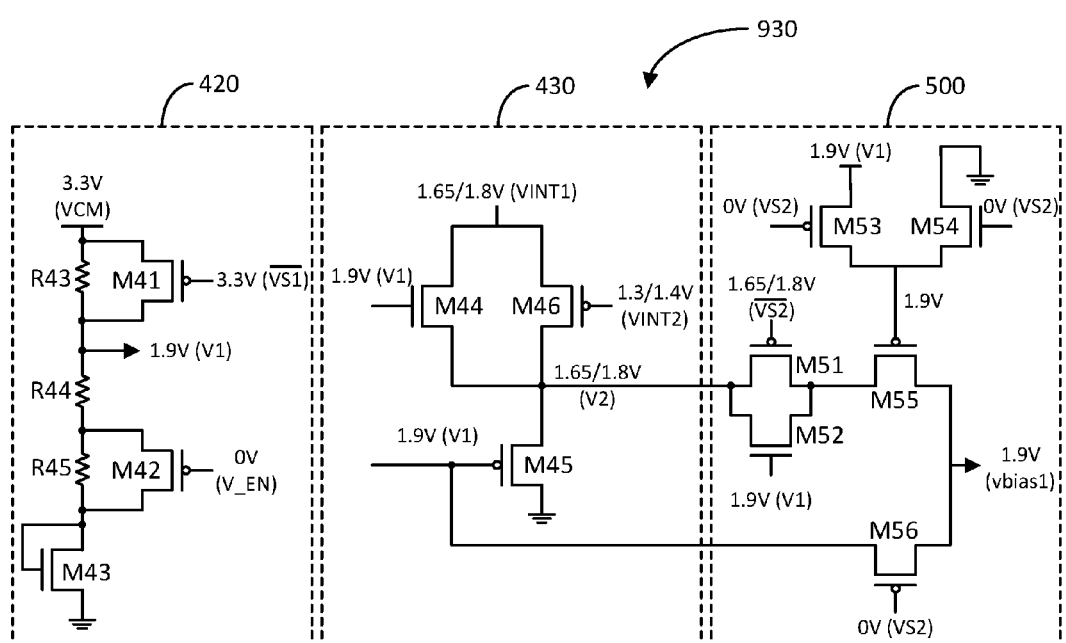

FIG. 9D pertains to a bias configuration 930 where the current source 312 of the transmit driver 300 is off, the internal voltages VINT1, VINT2, VS1, $\overline{VS1}$, and V_EN are generated, and the output terminals outp and outn of the transmit driver 300 are coupled to a 3.3 supply voltage source.

Because the Config signal indicates that the external supply voltage source is the 3.3V source, the internal voltage VS2 and $\overline{VS2}$ are at low and high logic voltages (e.g., 0V and 1.65/1.8V), respectively. The other internal voltages VINT1 and VINT2 are at 1.65/1.8V and 1.3/1.4V, respectively.

The voltage $\overline{VS1}$ is substantially at VCM since a level shifter (not shown) for converting $\overline{VS2}$ to $\overline{VS1}$ is not operational when the current source 312 of the transmit driver 300 is off. In this case, VCM (as well as $\overline{VS1}$) are at substantially 3.3V since the output terminals outp and outn of the transmit driver 300 are coupled to the 3.3 supply voltage source, and there are no IR losses occurring across the resistors R at the HDMI data sink device as the current source 312 of the transmit driver 300 is off.

With regard to the bias generator 420, the high logic voltage $\overline{VS1}$ at the gate of transistor M41 causes this transistor to turn off. The low voltage of the driver enable signal V_EN causes PMOS transistor M42 to turn on, and short out resistor R45. Thus, the first unselected bias voltage V1 may be given substantially by the following relationship:

$$V1 = VCM * \frac{R44}{R43 + R44} + 0.4 \text{ V}$$

Again, the 0.4V in the above equation is the voltage across the diode-connected transistor M43. The resistors R43 and R44 may be configured to generate the first unselected bias voltage V1 at substantially 1.9V.

With regard to the bias boost circuit 430, the first unselected bias voltage V1 is applied to the gates of transistors M44 and M45. Accordingly, the voltage V1 being at substantially 1.9V turns on NMOS transistor M44 and turns off PMOS transistor M45. As a result, the second unselected bias voltage V2 is brought up substantially to the internal voltage VINT1 of 1.65/1.8V.

With regard to the multiplexer 500, the first unselected bias voltage V1 is also applied to the gate of NMOS transistor M52. The internal voltage $\overline{VS2}$ is applied to the gate of PMOS transistor M51. Since the voltage V1 is substantially at 1.9V, the NMOS transistor M52 turns on. Since the internal voltage $\overline{VS2}$ is at 1.65/1.8V, the PMOS transistor M51 is turned off. As a result, the second unselected bias voltage V2 at 1.65/1.8V is applied to the source of PMOS transistor M55 via NMOS transistor M52.

The first unselected bias voltage V1 is also applied to the source of PMOS transistor M53. The internal voltage VS2 is applied to the gates of PMOS transistor M53 and NMOS transistor M54. Since the internal voltage VS2 is at a low logic voltage of 0V when the external supply voltage is at 3.3V, PMOS transistor M53 is turned on and NMOS transistor M54 is turned off. Accordingly, the first unselected bias voltage V1 at 1.9V is applied to the gate of PMOS transistor M55 via PMOS transistor M53. As a result, PMOS transistor M55 is turned off.

The first unselected bias voltage V1 is also applied to the source of PMOS transistor M56. The internal voltage VS2 is applied to the gate of PMOS transistor M56. Since the internal voltage VS2 is at a low logic voltage of 0V when the external supply voltage is at 3.3V, PMOS transistor M56 is turned on. Accordingly, the first unselected bias voltage V1 is applied to the output of the multiplexer 500 via PMOS transistor M56 to generate the bias voltage vbias1 at substantially 1.9V. Since PMOS transistor M55 is turned off, the transistor M55 isolates the internal supply voltage rail VINT1 from the bias voltage Vbias1. The bias voltage vbias1 being at 1.9V protects the transistors M31-M36 from over-voltage stress that would otherwise be caused by the 3.3V at the output terminals outp/outn of the transmit driver 300.

Figure 9E:
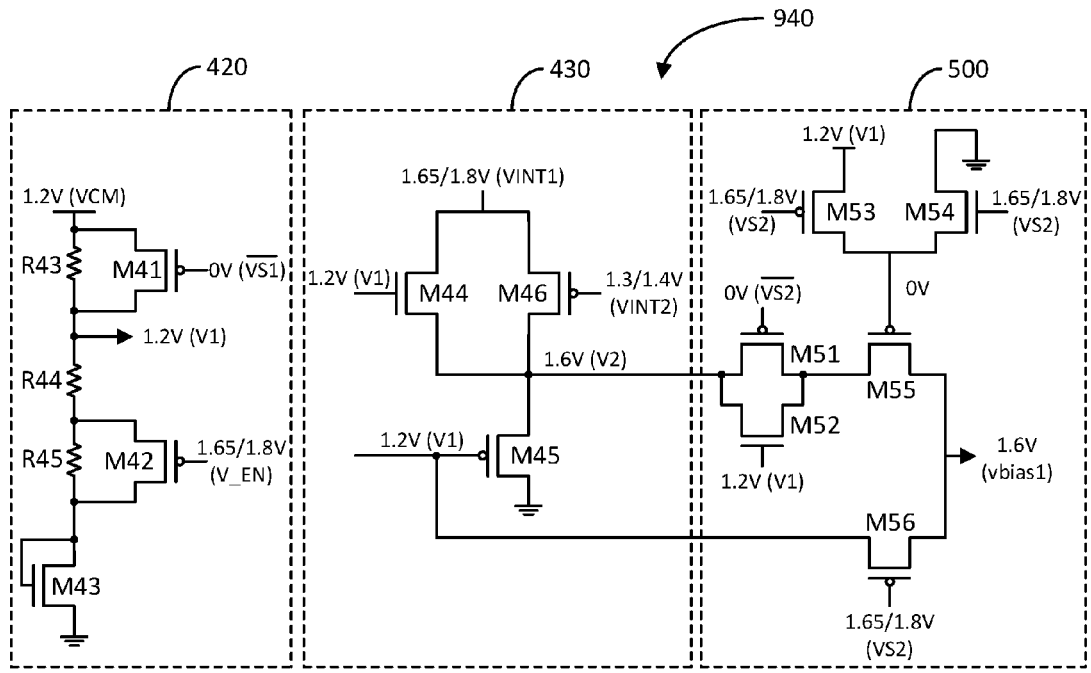

FIG. 9E pertains to a bias configuration 940 where the transmit driver 300 is in functional mode to generate the output differential data signal txp/txn based on the input differential signal Vin_p/Vin_n. Additionally, the bias configuration 940 also pertains to the case where the Config signal indicates that the external supply voltage is provided by a 1.8V supply voltage source at the bridge chip. In such configuration 940, the output terminals outp/outn of the transmit driver 300 are coupled to the external supply voltage source, the internal voltages are generated, and the configurable current source 312 is enabled.

Because the Config signal indicates that the external supply voltage source is the 1.8V source, the internal voltages VS2 and $\overline{VS2}$ are at high and low logic voltages (e.g., 1.65/1.8V and 0V), respectively. The other internal voltages VINT1 and VINT2 are at 1.65/1.8V and 1.3/1.4V, respectively. The voltage $\overline{VS1}$ is logically the same as the internal voltage $\overline{VS2}$, but in the 0V to VCM voltage domain. Since the internal voltage $\overline{VS2}$ is at a low logic voltage, $\overline{VS1}$ is also at a low logic voltage at substantially 0V.

With regard to the bias generator 420, the low logic voltage $\overline{VS1}$ at the gate of transistor M41 causes this transistor to turn on, and short out resistor R43. Thus, the first unselected bias voltage V1 is substantially the same as VCM, which, in this example, is substantially 1.2V.

With regard to the bias boost circuit 430, the first unselected bias voltage V1 is applied to the gates of transistors M44 and M45. Accordingly, the voltage V1 being at substantially 1.2V effectively turns on NMOS transistor M44 and effectively turns off PMOS transistor M45. As a result, the second unselected bias voltage V2 is approximately at the internal voltage VINT1 of 1.6V.

With regard to the multiplexer 500, the first unselected bias voltage V1 is also applied to the gate of NMOS transistor M52. The internal voltage $\overline{VS2}$ is applied to the gate of PMOS transistor M51. Since the voltage V1 is substantially at 1.2V, NMOS transistor M52 turns on. Since the internal voltage $\overline{VS2}$ is at 0V, the PMOS transistor M51 is turned on. As a result, the second unselected bias voltage V2 at 1.6V is applied to the source of PMOS transistor M55 via transistors M51 and M52.

The first unselected bias voltage V1 is also applied to the source of PMOS transistor M53. The internal voltage VS2 is applied to the gates of PMOS transistor M53 and NMOS transistor M54. Since the internal voltage VS2 is at a high logic voltage of 1.65/1.8V when the external supply voltage is at 1.8V, PMOS transistor M53 is turned off and NMOS transistor M54 is turned on. Accordingly, the gate of PMOS transistor M55 is grounded (e.g., 0V) via PMOS transistor M54. As a result, PMOS transistor M55 is turned on. Thus, the second unselected bias voltage V2 is applied to the output of the multiplexer 500 as vbias1 via transistor M55.

The first unselected bias voltage V1 is also applied to the source of PMOS transistor M56. The internal voltage VS2 is applied to the gate of PMOS transistor M56. Since the internal voltage VS2 is at a high logic voltage of 1.65/1.8V when the external supply voltage is at 1.8V, PMOS transistor M56 is turned off. Thus, the transistor M56 isolates the differential outputs outp/outn of the transmit driver 300 from the bias voltage vbias1.

Figure 9F:
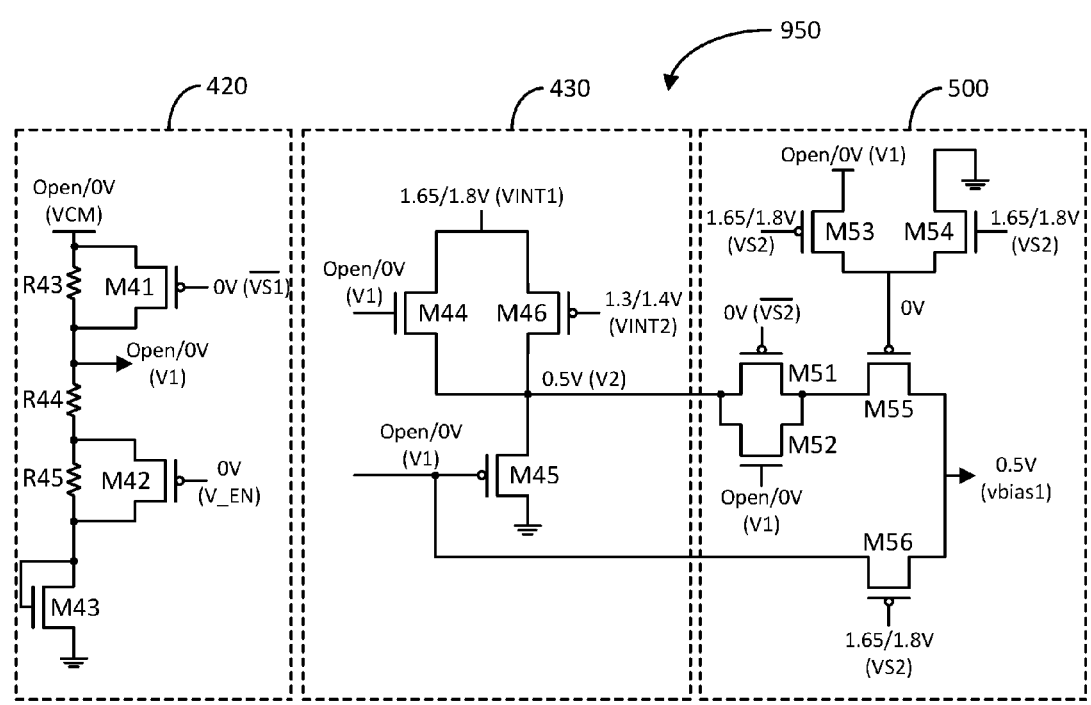

FIG. 9F pertains to a bias configuration 950 where the transmit driver 300 is not coupled to the external supply voltage source, the transmit driver current source 312 is off, and the internal voltages are generated. Additionally, the bias configuration 950 pertains to the case where the Config signal indicates that the external supply voltage is provided by a 1.8V supply voltage source of a bridge chip at the HDMI data source device. The bias configuration 950 pertains to the case where the bridge chip has yet to generate the 1.8V supply voltage. In such case, a signal detection circuit (not shown) may cause the configurable current source 312 of the transmit driver 300 to be turned off when the supply voltage at the output terminals outp/outn is not detected.

Because the Config signal indicates that the external supply voltage is provided by a 1.8V source, the internal voltage VS2 and $\overline{VS2}$ are at high and low logic voltages (e.g., 1.65/1.8V and 0V), respectively. The other internal voltages VINT1 and VINT2 are at 1.65/1.8V and 1.3/1.4V, respectively. The voltage $\overline{VS1}$ is substantially at VCM since a level shifter (not shown) for converting $\overline{VS2}$ to $\overline{VS1}$ is not operational when the current source 312 of the transmit driver 300 is off. In this case, VCM (as well as $\overline{VS1}$) are substantially open/0V as the output terminals outp and outn of the transmit driver 300 is not coupled to the 1.8 supply voltage source.

With regard to the bias generator 420, since VCM is an open/0V, there is no source voltage for generating the first unselected bias voltage V1. Accordingly, the first unselected bias voltage V1 is also at an open/0V.

With regard to the bias boost circuit 430, the first unselected bias voltage V1 is applied to the gates of transistors M44 and M45. Accordingly, the voltage V1 being at open/0V turns off NMOS transistor M44 and turns on PMOS transistor M45. As a result, the second unselected bias voltage V2 may reach a small voltage of about 0.5V.

With regard to the multiplexer 500, the first unselected bias voltage V1 is also applied to the gate of NMOS transistor M52. The internal voltage $\overline{VS2}$ is applied to the gate of PMOS transistor M51. Since the voltage V1 is at an open/0V, NMOS transistor M52 is turned off. Since the internal voltage $\overline{VS2}$ is at 0V, the PMOS transistor M51 is turned on; and applies the second unselected bias voltage V2 at substantially 0.5V to the source of PMOS transistor M55.

The first unselected bias voltage V1 is also applied to the source of PMOS transistor M53. The internal voltage VS2 is applied to the gates of PMOS transistor M53 and NMOS transistor M54. Since the first unselected bias voltage V1 is at an open/0V, there is no voltage source for the gate of PMOS transistor M55. As there is no voltage source for the source of PMOS transistor M55, the PMOS transistor M55 is turned on. Thus, the second unselected bias voltage V2 at 0.5V is applied to the output of the multiplexer 500 as vbias1 via the transistor M55.

The first unselected bias voltage V1 is also applied to the source of PMOS transistor M56. The internal voltage VS2 is applied to the gate of PMOS transistor M56. Since the internal voltage VS2 is at a high logic voltage of 1.65/1.8V when the external supply voltage is at 1.8V, PMOS transistor M56 is turned off. Thus, the transistor M55 isolates the differential outputs outp and outn of the transmit driver 300 from the bias voltage Vbias1.

Figure 9G:
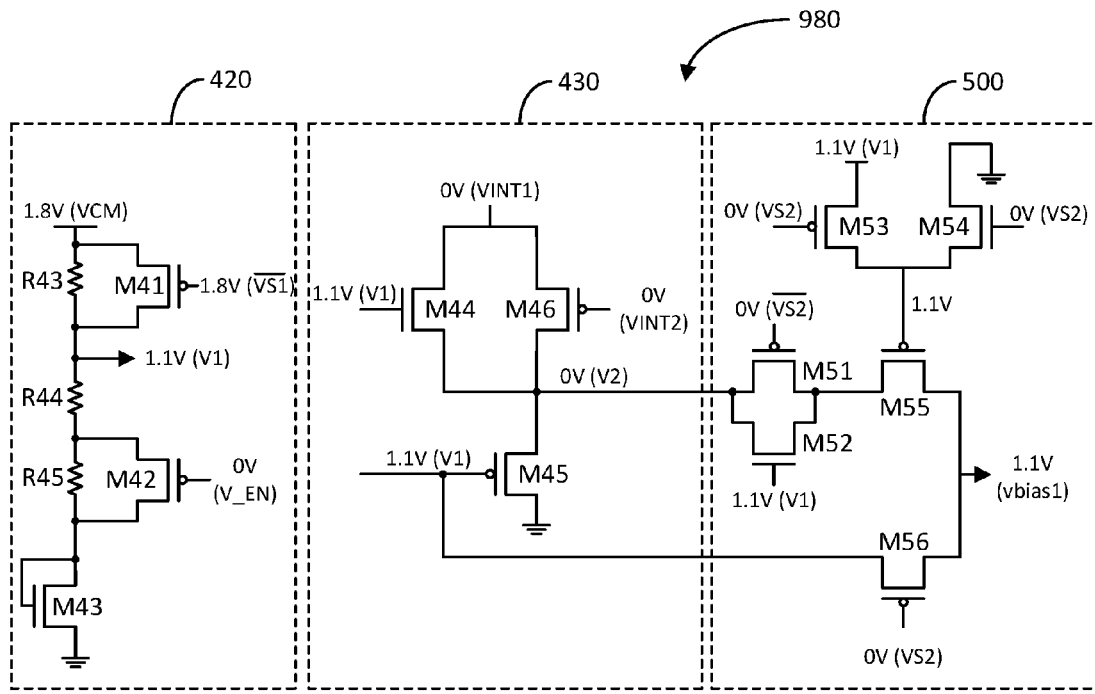

FIG. 9G pertains to a bias configuration 980 where the internal voltages VINT1, VINT2, VS1, $\overline{VS1}$, and V_EN have not been generated, the output terminals outp and outn of the transmit driver 300 is coupled to a 1.8V supply voltage source, and the configurable current source 312 is disabled. Accordingly, the internal voltages VINT1, VINT2, VS1, $\overline{VS1}$, and V_EN are all at substantially 0V.

The voltage $\overline{VS1}$ is substantially at VCM since a level shifter (not shown) for converting $\overline{VS2}$ to $\overline{VS1}$ is not operational when the current source 312 of the transmit driver 300 is off. In this case, VCM (as well as $\overline{VS1}$) are at substantially 1.8V since the output terminals outp and outn of the transmit driver 300 are coupled to the 1.8V supply voltage source.

With regard to the bias generator 420, the high logic voltage $\overline{VS1}$ at the gate of transistor M41 causes this transistor to turn off. The low logic voltage of the driver enable signal V_EN causes PMOS transistor M42 to turn on, and short out resistor R45. Thus, the first unselected bias voltage V1 may be given substantially by the following relationship:

$$V1 = VCM * \frac{R44}{R43 + R44} + 0.4 \text{ V}$$

Again, the 0.4V in the above equation is the voltage across the diode-connected transistor M43. The resistors R43 and R44 may be configured to generate the first unselected bias voltage V1 at substantially 1.1V.

With regard to the bias boost circuit 430, the first unselected bias voltage V1 is applied to the gates of transistors M44 and M45. Since the internal supply voltage VINT1 is substantially at 0V, there is no voltage source for transistors M44 and M46. Thus, transistors M44 and M46 are turned off. Similarly, since the source of PMOS transistor M45 is at substantially 0V, the PMOS transistor M45 is also turned off. As a result, the second unselected bias voltage V2 is also substantially at 0V.

With regard to the multiplexer 500, the first unselected bias voltage V1 is also applied to the gate of NMOS transistor M52. The internal voltage $\overline{VS2}$ is applied to the gate of PMOS transistor M51. Since the second unselected bias voltage V2 is at substantially 0V, there is no voltage source for the transistors M51 and M52. Accordingly, transistors M51 and M52 are turned off.

The first unselected bias voltage V1 is also applied to the source of PMOS transistor M53. The internal voltage VS2 is applied to the gates of PMOS transistor M53 and NMOS transistor M54. Since the internal voltage VS2 is at the logic low voltage of 0V, PMOS transistor M53 is turned on and NMOS transistor M54 is turned off. Accordingly, the first unselected bias voltage V1 at 1.1V is applied to the gate of PMOS transistor M55 via PMOS transistor M53. Since transistors M51 and M52 are turned off, there is no voltage source for transistor M55; thus, transistor M55 is turned off and isolates the internal supply source VINT1 and VINT2 from the bias voltage vbias1.

The first unselected bias voltage V1 is also applied to the source of PMOS transistor M56. The internal voltage VS2 is applied to the gate of PMOS transistor M56. Since the internal voltage VS2 is at the logic low voltage of 0V, PMOS transistor M56 is turned on. Accordingly, the first unselected bias voltage V1 is applied to the output of the multiplexer 500 via PMOS transistor M56 to generate the bias voltage vbias1 at substantially 1.1V. The bias voltage vbias1 being at 1.1V protects the transistors M31-M36 (with a relatively large margin) from over-voltage stress that may otherwise be caused by the 1.8V at the output terminals outp and outn of the transmit driver 300.

Figure 9H:
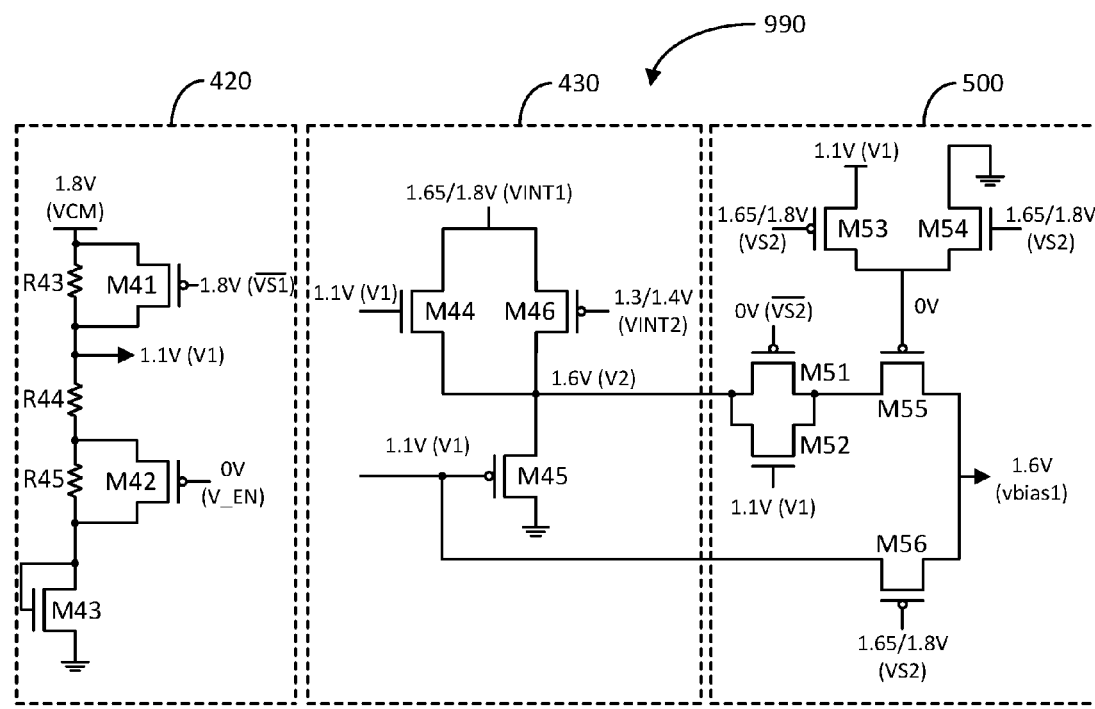

FIG. 9H pertains to a bias configuration 990 where the current source 312 of the transmit driver 300 is off, the internal voltages VINT1, VINT2, VS1, $\overline{VS1}$, and V_EN are generated, and the output terminals outp and outn of the transmit driver 300 are coupled to a 1.8V supply voltage source.

Because the Config signal indicates that the external supply voltage source is the 1.8V source, the internal voltage VS2 and $\overline{VS2}$ are at high and low logic voltages (e.g., 1.65/1.8V and 0V), respectively. The other internal voltages VINT1 and VINT2 are at 1.65/1.8V and 1.3/1.4V, respectively.

The voltage $\overline{VS1}$ is substantially at VCM since a level shifter (not shown) for converting $\overline{VS2}$ to $\overline{VS1}$ is not operational when the current source 312 of the transmit driver 300 is off. In this case, VCM (as well as $\overline{VS1}$) are at substantially 1.8V since the output terminals outp and outn of the transmit driver 300 are coupled to the 1.8 supply voltage source.

With regard to the bias generation circuit 420, the high logic voltage $\overline{VS1}$ at the gate of transistor M41 causes this transistor to turn off. The low logic voltage of the driver enable signal V_EN causes PMOS transistor M42 to turn on, and short out resistor R45. Thus, the first unselected bias voltage V1 may be given substantially by the following relationship:

$$V1 = VCM * \frac{R44}{R43 + R44} + 0.4 \text{ V}$$

Again, the 0.4V in the above equation is the voltage across the diode-connected transistor M43. The resistors R43 and R44 may be configured to generate the first unselected bias voltage V1 at substantially 1.1V.

With regard to the bias boost circuit 430, the first unselected bias voltage V1 is applied to the gates of transistors M44 and M45. Accordingly, the voltage V1 being at substantially 1.1V turns on NMOS transistor M44 and effectively turns off PMOS transistor M45. As a result, the second unselected bias voltage V2 may settle at substantially 1.6V, slightly lower than the internal voltage VINT1.

With regard to the multiplexer 500, the first unselected bias voltage V1 is also applied to the gate of NMOS transistor M52. The internal voltage $\overline{VS2}$ is applied to the gate of PMOS transistor M51. Since the voltage V1 is substantially at 1.1V, the NMOS transistor M52 turns on. Since the internal voltage $\overline{VS2}$ is at 0V, the PMOS transistor M51 is turned on. As a result, the second unselected bias voltage V2 at 1.6V is applied to the source of PMOS transistor M55 via transistors M51 and M52.

The first unselected bias voltage V1 is also applied to the source of PMOS transistor M53. The internal voltage VS2 is applied to the gates of PMOS transistor M53 and NMOS transistor M54. Since the internal voltage VS2 is at a high logic voltage of 1.65/1.8V when the external supply voltage is at 1.8V, PMOS transistor M53 is turned off and NMOS transistor M54 is turned on. Accordingly, the gate of PMOS transistor M55 is substantially grounded (e.g., 0V) via NMOS transistor M54. As a result, PMOS transistor M55 is turned on. As a result, the second unselected bias voltage V2 is applied to the output of the multiplexer 500 as vbias1 via transistor M55. The bias voltage vbias1 being at 1.6V protects the transistors M31-M36 (with a relatively large margin) from over-voltage stress that may otherwise be caused by the 1.8V at the output terminals outp/outn of the transmit driver 300.

The first unselected bias voltage V1 is also applied to the source of PMOS transistor M56. The internal voltage VS2 is applied to the gate of PMOS transistor M56. Since the internal voltage VS2 is at a high logic voltage of substantially 1.65/a.8V when the external supply voltage is at 1.8V, PMOS transistor M56 is turned off. Accordingly, transistor M56 isolates the output terminals outp and outn of the transmit driver 300 from the bias voltage Vbias1.

Figure 10:
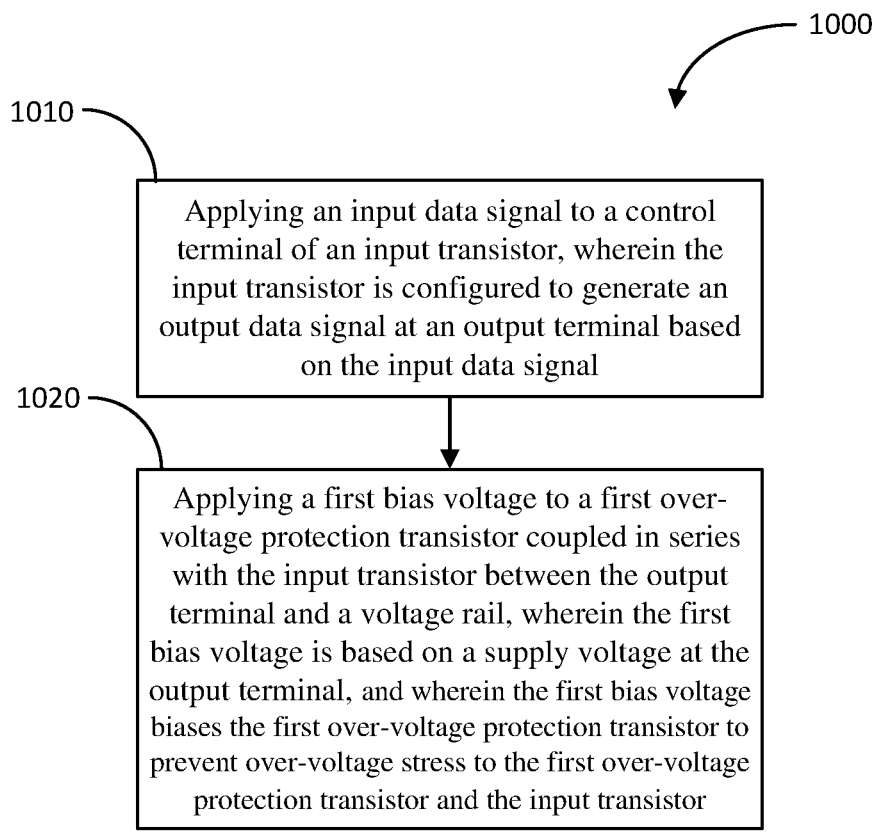
FIG. 10 illustrates a flow diagram of an exemplary method of generating an output data signal in accordance with another aspect of the disclosure.

FIG. 10 illustrates a flow diagram of an exemplary method 1000 of generating an output data signal in accordance with another aspect of the disclosure. The method 1000 includes applying an input data signal to a control terminal of an input transistor, wherein the input transistor is configured to generate an output data signal at an output terminal based on the input data signal (block 1010). An example of a means for applying an input data signal to a control terminal of an input transistor includes the predriver 310.

The method 1000 further includes applying a first bias voltage to a first over-voltage protection transistor coupled in series with the input transistor between the output terminal and a voltage rail, wherein the first bias voltage is based on a supply voltage at the output terminal, and wherein the first bias voltage biases the first over-voltage protection transistor to prevent over-voltage stress to the first over-voltage protection transistor and the input transistor (block 1020). An example of a means for applying a first bias voltage to a first over-voltage protection transistor includes the bias voltage generator 320.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
a pair of input transistors configured to generate an output differential data signal at output terminals based on an input differential data signal applied to control terminals of the pair of input transistors; and
a first pair of over-voltage protection transistors coupled in series with the pair of input transistors between the output terminals and a voltage rail, respectively, wherein the first pair of over-voltage protection transistors include control terminals configured to receive a first bias voltage based on a common mode voltage of the output differential data signal, and wherein the first bias voltage biases the first pair of over-voltage protection transistors to prevent over-voltage stress to the first pair of over-voltage protection transistors and the pair of input transistors, wherein the first bias voltage is at a first voltage level if the common mode voltage is formed using a supply voltage provided by a High-Definition Multimedia Interface (HDMI) data sink device.

2. The apparatus of claim 1, wherein the first bias voltage is at a second voltage level if the common mode voltage is formed using a supply voltage provided by a bridge chip at an HDMI data source device, wherein the second voltage level is different than the first voltage level.

3. The apparatus of claim 1, further comprising a first bias voltage generator configured to generate the first bias voltage.

4. The apparatus of claim 3, wherein the first bias voltage generator is configured to generate first and second unselected bias voltages based on the common mode voltage, wherein the first bias voltage is based on the first unselected bias voltage or the second unselected bias voltage.

5. The apparatus of claim 4, wherein the first bias voltage generator comprises a multiplexer configured to output the first unselected bias voltage or the second unselected bias voltage based on a configuration signal indicating a supply voltage used to form the common mode voltage, wherein the first bias voltage is based on the outputted first unselected bias voltage or the second unselected bias voltage.

6. The apparatus of claim 4, wherein the first bias voltage generator comprises a bias boost circuit configured to generate the second unselected bias voltage by boosting the first unselected bias voltage.

7. The apparatus of claim 3, wherein the first bias voltage generator comprises a common-mode sensor configured to generate the common-mode voltage based on the output differential data signal.

8. The apparatus of claim 3, wherein the bias voltage generator is configured to generate the first bias voltage based on one or more internal voltages.

9. An apparatus comprising:
a pair of input transistors configured to generate an output differential data signal at output terminals based on an input differential data signal applied to control terminals of the pair of input transistors;
a first pair of over-voltage protection transistors coupled in series with the pair of input transistors between the output terminals and a voltage rail, respectively, wherein the first pair of over-voltage protection transistors include control terminals configured to receive a first bias voltage based on a common mode voltage of the output differential data signal, and wherein the first bias voltage biases the first pair of over-voltage protection transistors to prevent over-voltage stress to the first pair of over-voltage protection transistors and the pair of input transistors; and
a first bias voltage generator configured to generate the first bias voltage, wherein the bias voltage generator is configured to generate the first bias voltage based on one or more internal voltages, and wherein the bias voltage generator is configured to generate the first bias voltage:
at a first voltage level if a voltage is present at the output terminals, a current source for generating a current through the first pair of input transistors and the first pair of over-voltage protection transistors is enabled, and the one or more internal voltages are generated;
at a second voltage level if the voltage is not present at the output terminals, a current source for generating a current through the first pair of input transistors and the first pair of over-voltage protection transistors is disabled, and the one or more internal voltages are generated;
at a third voltage level if the voltage is present at the output terminals, the current source for generating the current through the first pair of input transistor and the first pair of over-voltage protection transistors is disabled, and the one or more internal voltages are not generated; and
at a fourth voltage level if the voltage is present at the output terminals, the current source for generating the current through the first pair of input transistors and the first pair of over-voltage protection transistors is disabled, and the one or more internal voltages are generated;
wherein the first, second, third, and fourth voltage levels biases the first pair of over-voltage protection transistors to prevent over-voltage stress to the first pair of over-voltage protection transistors and the pair of input transistors.

10. The apparatus of claim 1, wherein the first bias voltage varies as a function of a threshold voltage of a transistor.

11. An apparatus, comprising:
a pair of input transistors configured to generate an output differential data signal at output terminals based on an input differential data signal applied to control terminals of the pair of input transistors;
a first pair of over-voltage protection transistors coupled in series with the pair of input transistors between the output terminals and a voltage rail, respectively, wherein the first pair of over-voltage protection transistors include control terminals configured to receive a first bias voltage based on a common mode voltage of the output differential data signal, and wherein the first bias voltage biases the first pair of over-voltage protection transistors to prevent over-voltage stress to the first pair of over-voltage protection transistors and the pair of input transistors; and
a second pair of over-voltage protection transistors coupled in series with the first pair of over-voltage protection transistors and the pair of input transistors between the output terminal and the voltage rail, respectively, wherein the second pair of over-voltage protection transistors control terminals configured to receive a second bias voltage, and wherein the second bias voltage biases the second pair of over-voltage protection transistors to prevent over-voltage stress to the first pair of over-voltage protection transistors, the second pair of over-voltage transistors, and the pair of input transistors.

12. The apparatus of claim 11, wherein the second bias voltage varies as a function of a threshold voltage of a transistor.

13. The apparatus of claim 1, further comprising an impedance adjusting circuit configured to adjust an impedance at the output terminals based on a control signal.

14. An apparatus, comprising:
a pair of input transistors configured to generate an output differential data signal at output terminals based on an input differential data signal applied to control terminals of the pair of input transistors;
a first pair of over-voltage protection transistors coupled in series with the pair of input transistors between the output terminals and a voltage rail, respectively, wherein the first pair of over-voltage protection transistors include control terminals configured to receive a first bias voltage based on a common mode voltage of the output differential data signal, and wherein the first bias voltage biases the first pair of over-voltage protection transistors to prevent over-voltage stress to the first pair of over-voltage protection transistors and the pair of input transistors; and
an emphasis equalizer configured to apply emphasis equalization to the output differential data signal based on a control signal.

15. The apparatus of claim 14, wherein the emphasis equalizer comprises:
a second pair of input transistors including control terminals configured to receive a delayed input differential data signal;
a second pair of over-voltage protection transistors coupled in series with the second pair of input transistor between the output terminals and the voltage rail, respectively, wherein the second pair of over-voltage protection transistors include control terminals configured to receive the first bias voltage, and wherein the first bias voltage biases the second pair of over-voltage protection transistors to prevent over-voltage stress to the second pair of over-voltage protection transistors and the second pair of input transistors.

16. The apparatus of claim 15, wherein the emphasis equalizer further comprises a third pair of over-voltage protection transistors coupled in series with the second pair of over-voltage protection transistors and the second pair of input transistors between the output terminals and the voltage rail, respectively, wherein the third pair of over-voltage protection transistors include control terminals configured to receive a second bias voltage, and wherein the second bias voltage biases the third pair of over-voltage protection transistors to prevent over-voltage stress to the first and second pairs of over-voltage protection transistors and the second pair of input transistors.

17. A method, comprising:
applying an input differential data signal to control terminals of a pair of input transistors, wherein the pair of input transistors is configured to generate an output differential data signal at output terminals based on the input differential data signal;
applying a first bias voltage to a first pair of over-voltage protection transistors coupled in series with the pair of input transistors between the output terminal and a voltage rail, respectively, wherein the first bias voltage is based on a common mode voltage of the output differential signal, and wherein the first bias voltage biases the first pair of over-voltage protection transistors to prevent over-voltage stress to the first pair of over-voltage protection transistors and the pair of input transistors;
generating a first unselected bias voltage based on a voltage at the output terminals;
generating a second unselected bias voltage based on the voltage at the output terminals; and
generating the first bias voltage based on the first unselected bias voltage or the second unselected bias voltage.

18. The method of claim 17, further comprising:
outputting the first unselected bias voltage or the second unselected bias voltage based on a configuration signal indicating the voltage at the output terminals, wherein generating the first bias voltage comprises generating the first bias voltage based on the outputted first unselected bias voltage or the second unselected bias voltage.

19. The method of claim 18, wherein generating the second unselected bias voltage comprises generating the second unselected bias voltage by boosting the first unselected bias voltage.

20. The method of claim 17, further comprising generating the common-mode voltage, wherein generating the first bias voltage comprises generating the first bias voltage based on the common mode voltage.

21. The method of claim 17, further comprising generating the first bias voltage, wherein generating the first bias voltage comprises:
generating the first bias voltage at a first voltage level if a voltage is present at the output terminals, a current source for generating a current through the first pair of input transistors and the first pair of over-voltage protection transistors is enabled, and one or more internal voltages are generated;
generating the first bias voltage at a second voltage level if the voltage is not present at the output terminals, a current source for generating a current through the first pair of input transistors and the first pair of over-voltage protection transistors is disabled, and the one or more internal voltages are generated;
generating the first bias voltage at a third voltage level if the voltage is present at the output terminals, the current source for generating the current through the first pair of input transistors and the first pair of over-voltage protection transistors is disabled, and the one or more internal voltages are not generated; and
generating the first bias voltage at a fourth voltage level if the voltage is present at the output terminals, the current source for generating the current through the first pair of input transistors and the first pair of over-voltage protection transistors is disabled, and the one or more internal voltages are generated;
wherein the first, second, third, and fourth voltage levels biases the first pair of over-voltage protection transistors to prevent over-voltage stress to the first pair of over-voltage protection transistors and the pair of input transistors.

22. The method of claim 17, further comprising applying a second bias voltage to a second pair of over-voltage protection transistors coupled in series with the first pair of over-voltage protection transistors and the pair of input transistors between the output terminal and the voltage rail, respectively, wherein the second bias voltage biases the second pair of over-voltage protection transistors to prevent over-voltage stress to the first and second pairs of over-voltage protection transistors and the pair of input transistors.

23. An apparatus, comprising:
means for applying an input differential data signal to control terminals of a pair of input transistors, wherein the pair of input transistors is configured to generate an output differential data signal at output terminals based on the input differential data signal;
means for applying a first bias voltage to a first pair of over-voltage protection transistors coupled in series with the pair of input transistors between the output terminal and a voltage rail, respectively, wherein the first bias voltage is based on a common mode voltage of the output differential signal, and wherein the first bias voltage biases the first pair of over-voltage protection transistors to prevent over-voltage stress to the first pair of over-voltage protection transistors and the pair of input transistors;
means for generating a first unselected bias voltage based on a voltage at the output terminals;
means for generating a second unselected bias voltage based on the voltage at the output terminal; and
means for generating the first bias voltage based on the first unselected bias voltage or the second unselected bias voltage.

24. The apparatus of claim 23, further comprising means for outputting the first unselected bias voltage or the second unselected bias voltage based on a configuration signal indicating the voltage at the output terminal, wherein the means for generating the first bias voltage comprises means for generating the first bias voltage based on the outputted first unselected bias voltage or the second unselected bias voltage.

25. The apparatus of claim 23, further comprising means for generating the common-mode voltage, wherein the means for generating the first bias voltage comprises means for generating the first bias voltage based on the common mode voltage.

26. The apparatus of claim 23, further comprising:
means for generating the first bias voltage, wherein the means for generating the first bias voltage comprises:
means for generating the first bias voltage at a first voltage level if a voltage is present at the output terminals, a current source for generating a current through the first pair of input transistors and the first pair of over-voltage protection transistors is enabled, and one or more internal voltages are generated;
means for generating the first bias voltage at a second voltage level if the voltage is not present at the output terminals, a current source for generating a current through the first pair of input transistors and the first pair of over-voltage protection transistors is disabled, and the one or more internal voltages are generated;

means for generating the first bias voltage at a third voltage level if the voltage is present at the output terminals, the current source for generating the current through the first pair of input transistors and the first pair of over-voltage protection transistors is disabled, and the one or more internal voltages are not generated; and means for generating the first bias voltage at a fourth voltage level if the voltage is present at the output terminals, the current source for generating the current through the first pair of input transistors and the first pair of over-voltage protection transistors is disabled, and the one or more internal voltages are generated;

wherein the first, second, third, and fourth voltage levels biases the first pair of over-voltage protection transistors to prevent over-voltage stress to the first pair of over-voltage protection transistors and the pair of input transistors.

27. The apparatus of claim 23, further comprising means for applying a second bias voltage to a second pair of over-voltage protection transistors coupled in series with the first pair of over-voltage protection transistors and the pair of input transistors between the output terminal and the voltage rail, respectively, wherein the second bias voltage biases the second pair of over-voltage protection transistors to prevent over-voltage stress to the first and second pairs of over-voltage protection transistors and the pair of input transistors.

* * * * *